(12) United States Patent
Oohirabaru et al.

(10) Patent No.: US 7,585,383 B2
(45) Date of Patent: Sep. 8, 2009

(54) VACUUM PROCESSING APPARATUS

(75) Inventors: Yuuzou Oohirabaru, Kudamatsu (JP); Akira Ueda, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 229 days.

(21) Appl. No.: 10/928,368

(22) Filed: Aug. 30, 2004

(65) Prior Publication Data

US 2005/0193948 A1 Sep. 8, 2005

(30) Foreign Application Priority Data

Mar. 8, 2004 (JP) ............................. 2004-064618

(51) Int. Cl.
*C23F 1/00* (2006.01)
*H01L 21/306* (2006.01)
*C23C 16/00* (2006.01)

(52) U.S. Cl. ............................. 156/345.32; 156/345.31; 118/719; 414/939

(58) Field of Classification Search ............ 156/345.31, 156/345.32; 118/719; 414/939
See application file for complete search history.

(56) References Cited

U.S. PATENT DOCUMENTS

| | | | | |
|---|---|---|---|---|
| 4,017,983 A | * | 4/1977 | Fraser | 34/92 |
| 4,823,478 A | * | 4/1989 | Thompson, Sr. | 34/287 |
| 4,852,516 A | * | 8/1989 | Rubin et al. | 118/715 |
| 5,076,205 A | * | 12/1991 | Vowles et al. | 118/719 |
| 5,461,214 A | * | 10/1995 | Peck et al. | 219/390 |
| 5,950,327 A | * | 9/1999 | Peterson et al. | 34/328 |
| 7,032,614 B2 | * | 4/2006 | Lappen et al. | 137/312 |
| 2002/0116882 A1 | * | 8/2002 | Reinke et al. | 52/220.8 |

FOREIGN PATENT DOCUMENTS

JP 6-267808 9/1994

* cited by examiner

*Primary Examiner*—Karla Moore
(74) *Attorney, Agent, or Firm*—Antonelli, Terry, Stout & Kraus, LLP.

(57) ABSTRACT

The present invention provides a vacuum processing apparatus which is small-sized and requires a small installation area. The vacuum processing apparatus includes a vacuum container which has a processing chamber inside thereof, wherein the pressure inside the processing chamber is reduced and plasma used for processing a sample is formed inside the processing chamber, a bed portion which is arranged below the vacuum container and stores a device for supplying electricity and electric signals used for processing inside the vacuum container, and a transport chamber which is connected with the vacuum container and includes a transport device for transporting the sample inside thereof. The vacuum processing apparatus further includes a connector portion which is mounted on the bed portion in a state that the connector portion faces a lower portion of the transport chamber, wherein the bed portion is configured to be detachably mounted on the vacuum processing apparatus in a state that the bed portion performs the connection and the disconnection at the connector portion.

5 Claims, 16 Drawing Sheets

VACUUM PROCESSING APPARATUS

BACKGROUND OF THE INVENTION

The present invention relates to a vacuum processing apparatus which processes an object to be processed in the inside of pressure-reduced apparatus, and more particularly to an apparatus which processes, by using plasma, a semiconductor substrate (wafer) which constitutes the object to be processed in the inside of the apparatus.

In the above-mentioned apparatus, particularly in the apparatus which processes the object to be processed in the inside of the pressure-reduced apparatus, along with a demand for the finer processing and the more accurate processing, there has been a demand for the enhancement of the efficiency of the processing of the substrate which constitutes the object to be processed. Accordingly, in recent years, a multi-chamber apparatus which is provided with a plurality of processing chambers which are connected to one apparatus has been developed, wherein the processing formed of a plurality of steps is applied to a substrate as an object to be processed by using one apparatus so as to enhance the efficiency of the processing.

With respect to such an apparatus which performs the processing in a state that the apparatus is provided with the plurality of process rooms or chambers, in the respective process rooms or the processing chamber, the gas inside these process rooms or the processing chamber and the pressure of the gas are adjusted such that the pressure can be reduced. Further, these process rooms or the processing chamber are connected with the transport room (transport chamber) in which a robot arms or the like for transporting a substrate is provided.

Due to such a constitution, the substrate before the processing or after the processing is transported from one processing chamber to another processing chamber through the inside of the transport chamber in which the pressure is reduced or in which an inert gas is introduced, so that the processing can be continuously applied to the sample without bringing the substrate into contact with the outdoor air. Accordingly, the contamination of the substrate can be suppressed and a yield rate and the efficiency of the processing can be enhanced.

Further, the time for elevating or reducing the pressure inside the processing chamber or the transport chamber can be omitted or reduced and hence, the steps of the process can be shortened, the time and efforts necessary for the whole processing of the substrate can be suppressed whereby the efficiency of processing is enhanced.

Still further, with respect to such an apparatus, the respective processing chambers are replaceably or detachably mounted on the apparatus and hence, the apparatus can cope with the process of new processing by exchanging the processing chambers or the combination of the processing chambers without exchanging the apparatus body whereby the cost of manufacturing products by performing the substrate processing can be suppressed to a low cost.

As the related prior art of the vacuum processing apparatus on which these processing chambers are detachably mounted, a technique disclosed in Japanese Patent Laid-Open No. H6 (1994)-267808 has been known. In this related art, respective processing chambers which process a semiconductor wafer are detachably mounted on a wafer transport chamber. Further, each processing chambers are provided with a movable stage which is movable along an X axis, a Y axis or a Z axis below the processing chamber, wherein due to the movement of these stages, the mounting positions of the respective processing chambers on the wafer transport chamber can be adjusted. Due to such a constitution, this related art can ease the positioning of the respective processing chambers with respect to the transport chamber, thus facilitating the mounting and dismounting operation.

SUMMARY OF THE INVENTION

The above-mentioned related prior art, however, has failed to pay the sufficient consideration on following points and hence, the related art still has some drawbacks.

As described above, when a plurality of processing chambers are arranged close to the apparatus, due to guide mechanisms including the movable stages below the apparatus, the size of detachable units becomes large and hence a contact area of the apparatus is enlarged. Accordingly, no consideration has been paid to a point that the number of installable apparatuses on a floor of a clean room or the like on which the apparatuses are installed is lowered so that the manufacturing efficiency when products are manufactured by operating a plurality of apparatuses is lowered.

Further, by reducing the size of the guide mechanisms to decrease the apparatus installation area, it is possible to reduce spaces among a plurality of processing chambers. However, this leads to the reduction of spaces necessary for performing the connection/disconnection operation of the respective processing chambers or for performing the maintenance. Accordingly, the efficiency of mounting and dismounting operation and maintenance operation is lowered, thus leading to the prolongation of the operation time. Eventually, there has been a drawback that a non-operative period that the apparatus is not operated is prolonged and hence, the operation efficiency of the apparatus is lowered and the manufacturing cost is increased. Also in this case, no consideration has been paid to in this drawback.

Further, with respect to the related art, although the connection between the respective processing chambers and the transport chamber has been taken into consideration, no consideration has been taken on the constitution which facilitates the mounting and dismounting operation of various equipment for performing processing in the inside of the processing chambers, for example, equipment which supplies a process gas and air, an exhaust mechanism, a power source, and a refrigerant supply mechanism for cooling parts in the inside of the processing chambers. That is, in mounting or dismounting the equipment in the processing chambers, no consideration has been take with respect to the constitution which enhances the operation efficiently other than positioning, thus giving rise to a drawback that the operation time is prolonged and hence, the operation efficiency of the apparatus is deteriorated.

Further, insufficient consideration is taken on the constitution to realize given performances in a stable manner in the respective processing chambers after mounting the respective processing chambers. That is, after mounting the respective processing chambers, there may be a case that it is found that some mounted processing chambers differ from the chambers before the mounting operation. In this case, it is necessary to perform the adjustment of the chambers after mounting such that the apparatus can obtain the given performance in each mounted processing chamber. Accordingly, the mounting or dismounting and the maintenance of the processing chambers are prolonged whereby the operation efficiency of the apparatus is lowered. This drawback has not been taken into consideration.

Further, in the above-mentioned related art, when the maintenance or the mounting or dismounting operation is performed in one processing chamber, it is impossible to perform the processing in other processing chambers which are mounted on the wafer transport chamber and hence, an interval of the mounting or dismounting operation or the maintenance performed in one particular processing chamber becomes an interval of these operations in the apparatus whereby the apparatus is stopped in spite of the fact that the processing of other processing chamber can be performed. Accordingly, the operation efficiency of the apparatus is remarkably deteriorated. This drawback has not been also taken into consideration.

Further, in performing the operation in the inside of each processing chamber, it is necessary to set the pressure inside the processing chamber substantially equal to the external pressure and it is also necessary to reduce the pressure inside the processing chamber to perform another operation and then processing of the substrate in the processing chamber after performing the preceding operation. When the time for elevation/lowering of pressure is long, the time for the operation and the processing in the processing chamber is relatively reduced and the operation efficiency of the device as a whole is reduced, thus giving rise to a drawback that the manufacturing cost of the products is increased. This drawback has not been taken into consideration.

It is an object of the present invention to provide a vacuum processing apparatus which is small-sized and hence requires a small installation area.

It is another object of the present invention to provide a vacuum processing device which can easily perform operations such as maintenance, mounting and dismounting of equipment.

It is still another object of the present invention to provide a vacuum processing apparatus which can enhance the operation efficiency.

To achieve the above-mentioned object, the present invention is directed to a vacuum processing apparatus which includes a vacuum container having a processing chamber inside thereof, wherein the pressure inside the processing chamber is reduced and plasma used for processing a sample is formed inside the processing chamber, a bed portion which is arranged below the vacuum container and stores a device for supplying electricity and electric signals used for processing inside the vacuum container, and a transport chamber which is connected with the vacuum container and includes a transport device for transporting the sample inside thereof, wherein the vacuum processing apparatus further includes a connector portion which is mounted on the bed portion in a state that the connector portion faces a lower portion of the transport chamber, wherein the vacuum processing apparatus is connected with the bed portion in an operable manner, and the bed portion is configured to be detachably mounted on the vacuum processing apparatus in a state that the bed portion performs the connection and the disconnection at the connector portion.

The present invention is also directed to a vacuum processing apparatus which includes a vacuum container which has a processing chamber inside thereof, wherein the pressure inside the processing chamber is reduced and plasma used for processing a sample is formed inside the processing chamber, a bed portion which is arranged below the vacuum container and stores a device for supplying electricity and electric signals used for processing inside the vacuum container, and a transport chamber which is connected with the vacuum container and includes a transport device for transporting the sample inside thereof, wherein the vacuum processing apparatus further includes a drawer portion which is mounted on the bed portion, stores a device for supplying electricity and electric signals and which is approximately horizontally pulled from the bed portion or stored in the bed portion.

According to the present invention, it is possible to provide the vacuum processing apparatus which is small-sized and requires a small installation area.

Further, according to the present invention, it is possible to provide the vacuum processing apparatus which can easily perform the operations such as the maintenance and mounting and dismounting of the equipment.

Still further, it is also possible to provide the vacuum processing apparatus which can enhance the operation efficiency of the vacuum processing apparatus.

PREFERRED EMBODIMENTS OF THE INVENTION

Figure 1A:
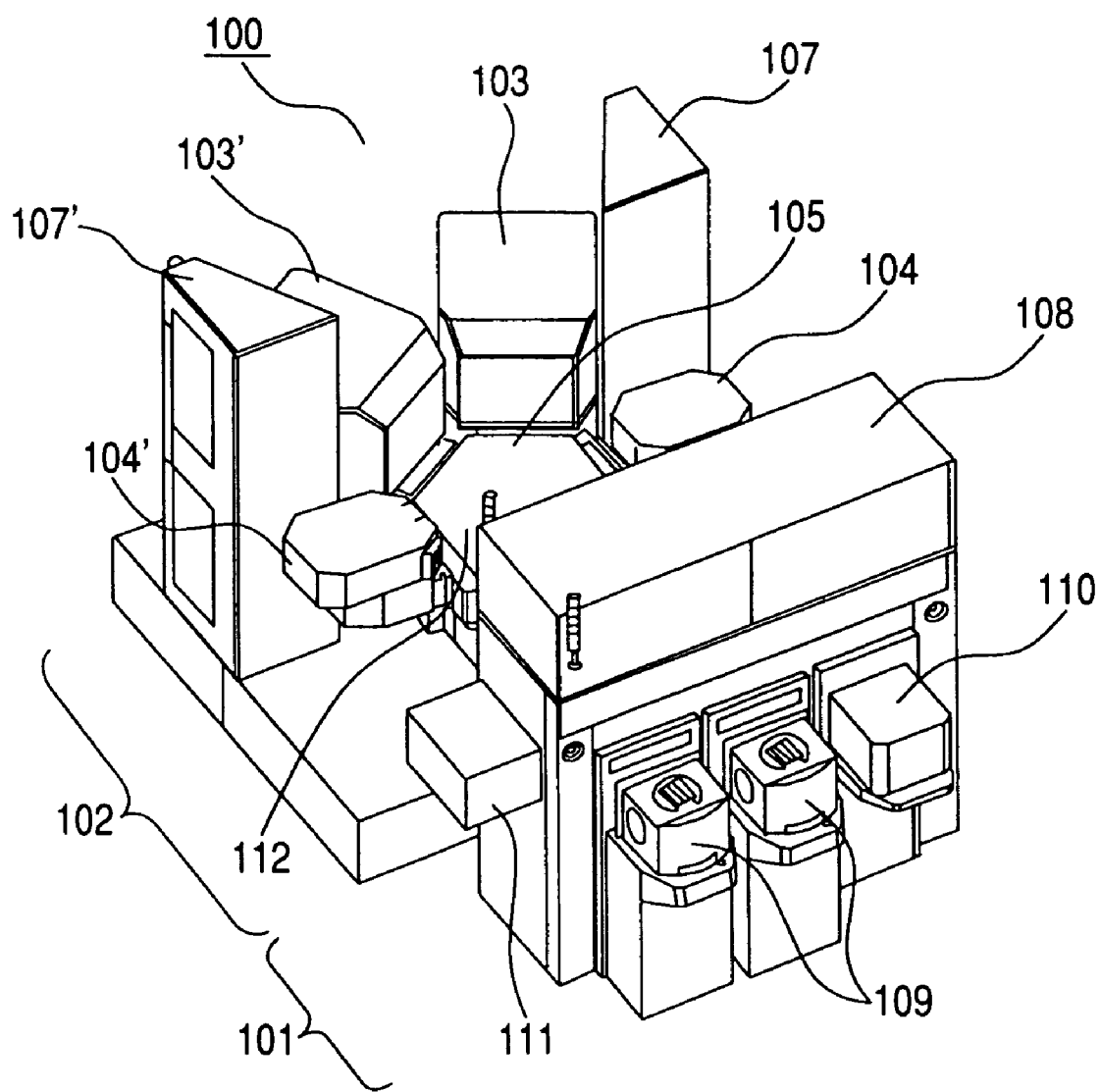
FIG. 1A is a perspective view as viewed from the front showing the whole constitution of a vacuum processing apparatus according to an embodiment of the present invention.
Figure 1B:
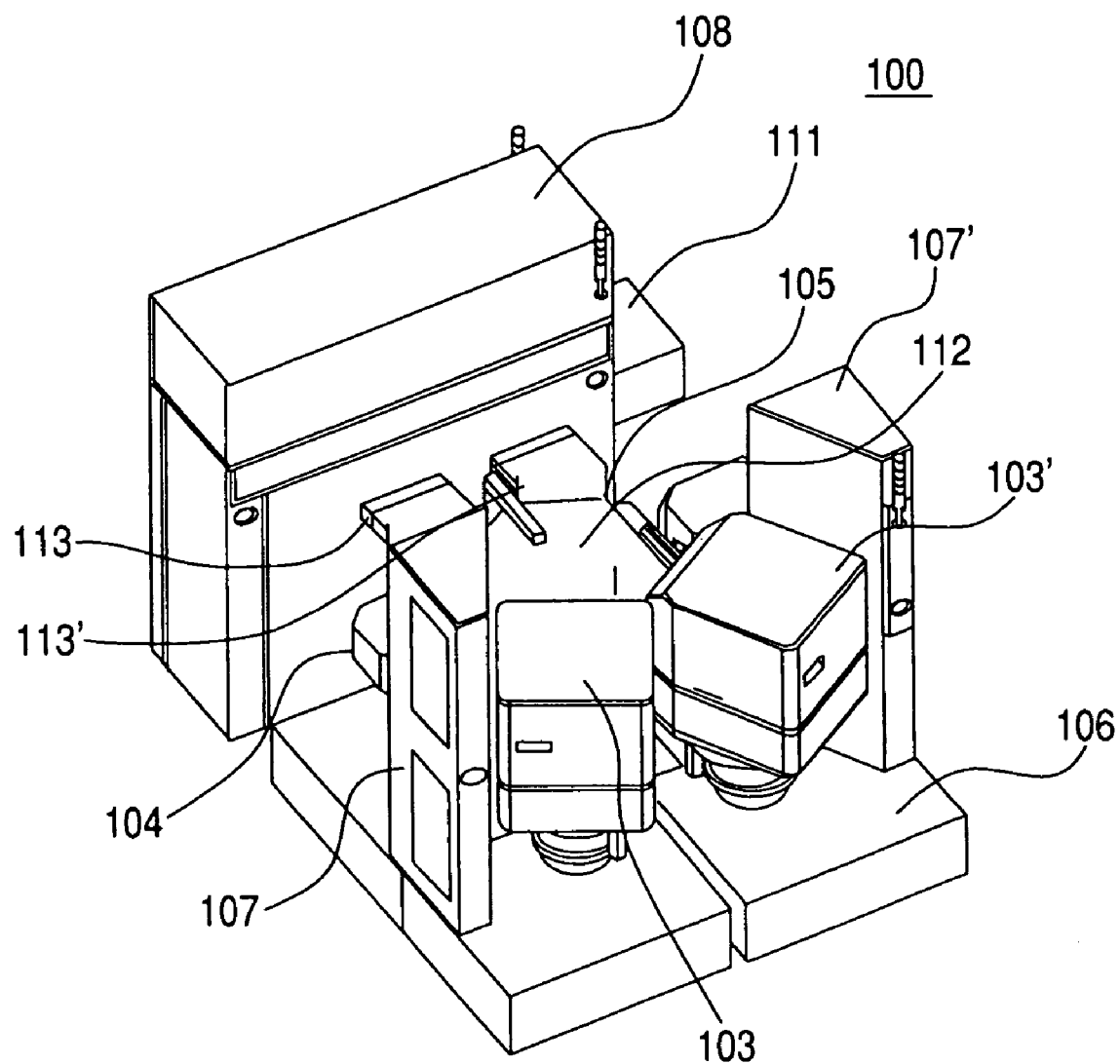
FIG. 1B is a perspective view as viewed from the back showing the whole constitution of the vacuum processing apparatus shown in FIG. 1A.

Preferred embodiments of the present invention are described in detail in conjunction with attached drawings hereinafter. FIGS. 1A and 1B are perspective views showing the whole constitution of a vacuum processing apparatus according to an embodiment of the present invention, in which FIG. 1A is a view as viewed from the front and FIG. 1B is a perspective view as viewed from the back.

In these drawings, the vacuum processing apparatus 100 of this embodiment is roughly classified into two blocks, that is, front and rear blocks. The front side of an apparatus body 100 constitutes an atmospheric-pressure-side block 101 which enables the transporting of a wafer supplied to the apparatus into a chamber whose pressure is reduced under an atmospheric pressure and the supplying of the wafer into the processing chamber. Behind the apparatus body 100, the process block 102 is arranged. The process block 102 includes processing units 103, 103' and 104, 104' which have processing chambers for processing the wafer in a reduced-pressure state, a transport unit 105 which transports the wafer to these processing chambers under a reduced pressure, and a plurality of lock chambers which capable of connecting the transport unit 105 to the atmospheric-pressure-side block 101 for transporting of a wafer. The pressure of these units is reduced and the reduced pressure with the high degree of vacuum is maintained, thus forming the processing unit into vacuum blocks.

The atmospheric-pressure-side block 101 includes a casing 108 which is provided with a transport robot (not shown in the drawing) therein. Further, the block 101 includes a wafer cassette 109 in which a cleaning wafer is housed and a dummy cassette 110 for a dummy wafer which are mounted in the casing 108. Further, the transport robot performs an operation to load and unload the wafer between these cassettes 109, 110 and a lock chamber unit 106. Further, the block 101 is provided with a positioning portion 111 on the casing 108 and the wafer which is transported in the inside of the positioning portion 111 is positioned in conformity with the posture of arrangement of wafer in the inside of the cassettes 109, 110 or the lock chamber unit 106.

Further, with respect to the processing units 103, 103', 104, 104' of the process block 102 in this embodiment, the processing units 103, 103' are etching processing units provided with etching chambers for performing etching processing of the wafer transported from the cassette 109 to the processing unit 102, while the processing units 104, 104' are ashing processing units which perform the ashing processing of the wafer. The transport unit 105 is provided with a transport chamber 112 in which these processing units are detachably mounted and the pressure inside thereof is reduced and is held with the high degree of vacuum.

Further, the processing unit 102 is arranged between the above-mentioned processing units 103, 103', 104, 104', and control units 107a, 107b which include mass flow controllers for adjusting the supply of fluid such as gas or liquid necessary for these units or the processing chambers are arranged close to the processing units 103, 103', 104, 104'. Further, below the processing unit 102, there are provided a rectangular bed which houses reservoir portions and discharge portions of various gases and refrigerants which are necessary corresponding to the above-mentioned respective processing units and utilities such as a power source which supplies electricity to these portions and a frame 106 which constitutes the bed. The processing chamber portions and the control units 107 of the processing units 103, 104 are configured and arranged such that they can be detachably mounted on the frame 106.

Figure 2A:
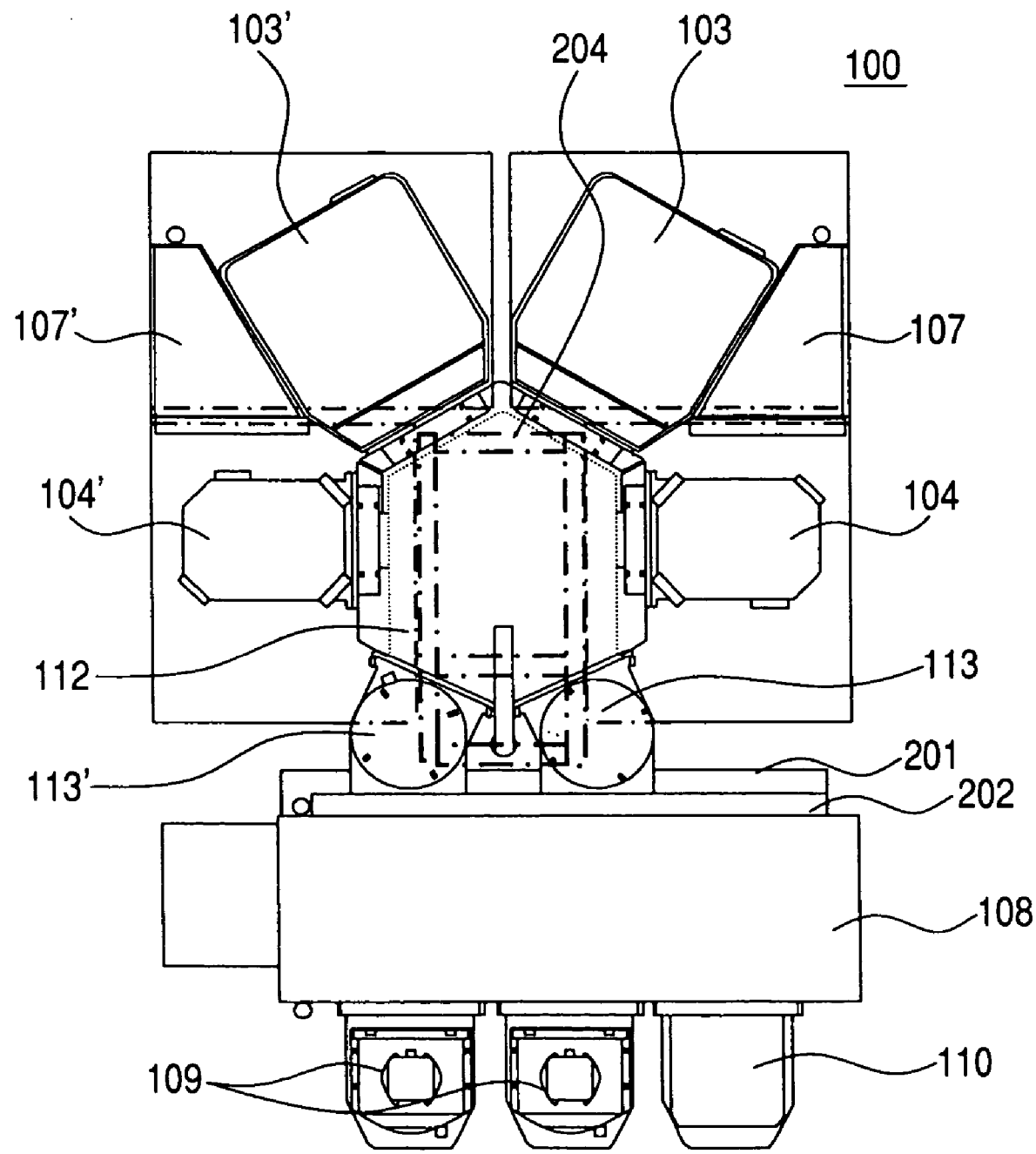
FIG. 2A is a top plan view showing the schematic constitution of the vacuum processing apparatus according to one embodiment shown in FIGS. 1A and 1B.
Figure 2B:
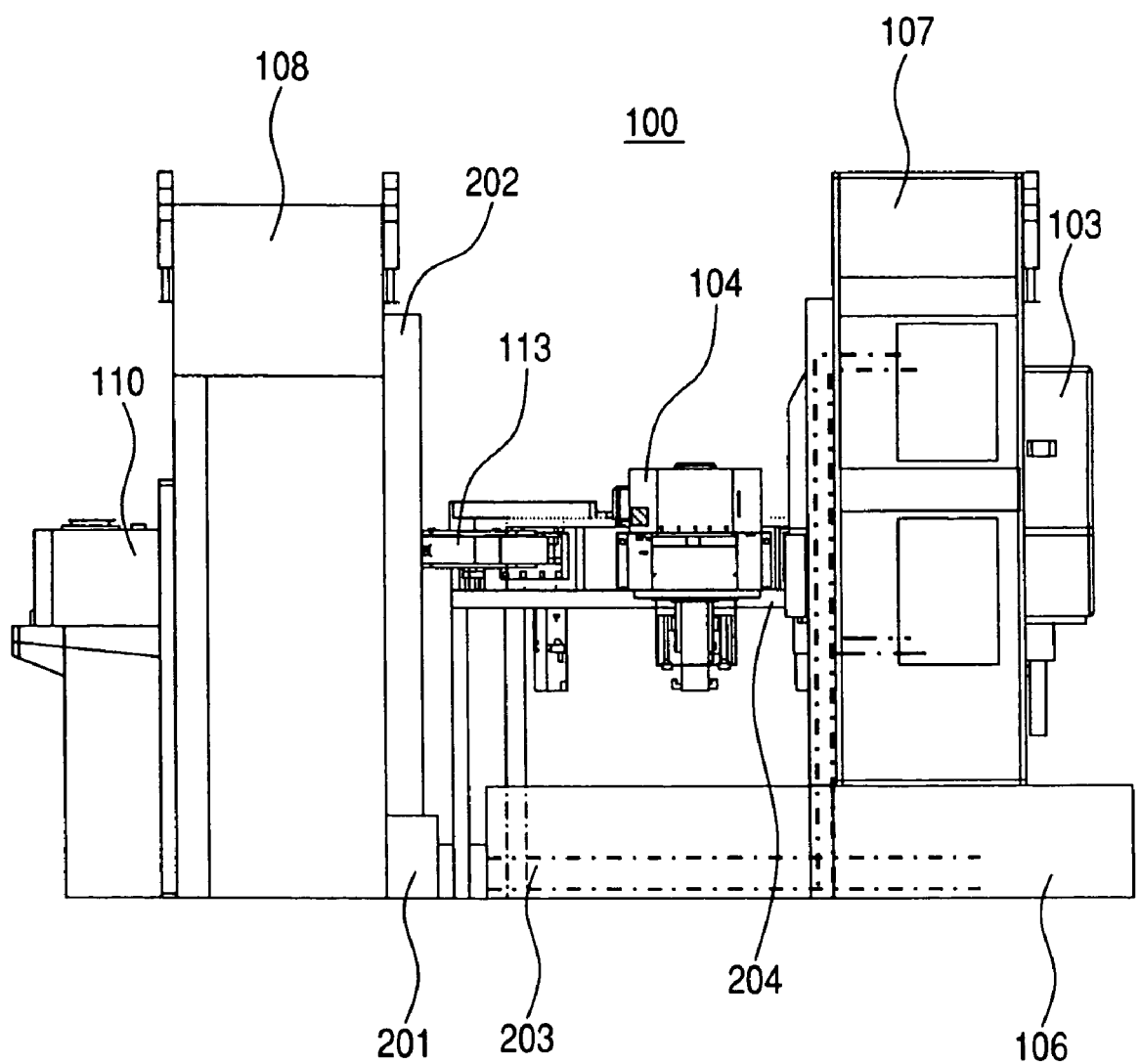
FIG. 2B is a side view showing the schematic constitution of the vacuum processing apparatus according to one embodiment shown in FIG. 1.

FIG. 2A and FIG. 2B are explanatory views showing the schematic constitution of the vacuum processing apparatus 100 according to the embodiment shown in FIGS. 1A and 1B, wherein FIG. 2A is a plan view as viewed from above and FIG. 2B is a side view as viewed from the side. In this embodiment, the atmospheric-pressure-side block 101 which is arranged at the front side of the apparatus body 100 constitutes a portion where the handling of the wafer including transporting, housing, positioning, and the like of the wafer is performed under the atmospheric pressure, while the process block 102 at the rear side of the device body 100 constitutes a portion which performs transporting, processing, and the like of the wafer under pressure which is reduced from the atmospheric pressure and increases or decreases the pressure in a state that the wafer is mounted.

Further, as mentioned above, between the transport chamber 112 and the atmospheric-pressure block 101 which constitute the transport unit 105, lock chambers 113, 113' which connect the transport chamber 112 and the block 101 and transport the wafer between them are arranged. The pressure inside these lock chambers 113, 113' is reduced and, after the wafer which is mounted on a robot arm (not shown in the drawing) and is transported into the inside of the transport chamber 112, the pressure inside the lock chambers 113, 113' is elevated to the atmospheric pressure and, thereafter, the wafer is mounted on another robot arm (not shown in the drawing) which is arranged in the inside of the atmospheric-pressure-side block 101 and is taken out to the atmospheric-pressure-side block 101 side. The taken-out wafer is returned to the original position in the inside of the cassette 109 or is returned to either one of these cassettes. Alternatively, the wafer which is taken out by the robot arm from either one of these cassettes 109 is mounted in the inside of the lock chamber 113a or 113b which is set to the outdoor pressure and, thereafter, the pressure inside the lock chamber 113 or 113' is reduced and the wafer is mounted on the robot arm in the inside of the transport chamber 112 whose inner pressure is also reduced and, thereafter, is transported to either one of the above-mentioned processing units 103, 103' or 104, 104' through the inside of the transport chamber 112.

To perform the above-mentioned operations, the lock chamber 113 and 113' are connected to the atmospheric-pressure-side block 101 and transport chamber 112, respectively. A gas supply device and a gas exhaust device are connected to the lock chamber 113 and 113', whereby, inside of the lock chambers 113 or 113', the pressure is elevated, reduced or maintained in a state that the wafer which is transported through the lock chambers 113, 113' is mounted. Accordingly, in the lock chamber 113, there is provided a gate valve (not shown in the drawing) which is opened or closed in front of or behind the lock chamber 113 and seals the inside of the lock chamber 113. Further, in the inside of these lock chambers 113, 113', tables on which the wafer is placed are arranged and these tables include fixing means which prevent the movement of the wafer when the inner pressure is elevated or lowered. That is, these lock chambers 113, 113' are configured to have means to seal the lock chambers 113, 113' against the pressure difference between inner and outer pressures which is formed in a state that a wafer is mounted in the inside of the lock chamber 113, 113'.

As described above, the transport unit 105 is constituted of the transport chamber 112 in which the robot arm (not shown in the drawing) which transports the wafer between the respective chambers 103, 104 and the lock chamber 112 whose inner pressure is reduced and the above-mentioned plurality of lock chambers 113, 113'. Here, in this embodiment, one sample transport device 506 is arranged in the inside of the transport chamber 112 so as to enable the exchange of the sample between four processing units which are arranged in the periphery of the transport chamber 112 and the atmospheric-pressure-side block 101.

Further, as mentioned above, in this embodiment, the processing units 103, 103' and the 104, 104' are formed of two etching processing units and two ashing processing units. These processing units are provided in a state that processing units are connected with respective sides of the polygonal transport chamber 112 of the transport unit 105. Two processing units which constitute etching processing units 103, 103' are connected to two sides of the transport chamber 112 at a depth side and the processing units which constitute the ashing processing units 104, 104' are connected to two sides of the transport unit 105 respectively close to the etching processing units 103, 103'. Further, the lock chambers 113, 113' are connected to the remaining side of the transport chamber 112. That is, in this embodiment, two etching processing chambers and two ashing processing units are arranged in the periphery of the transport chamber 112. According to this embodiment, the transport chamber 112 is roughly hexagon in plan view.

Further, in this embodiment, the processing units 103, 103' and the processing units 104, 104' which are connected to the transport unit 105 are configured to be detachably mounted on the transport unit 105 and, at the same time, in the transport unit 105, the lock chambers 113, 113' and the transport chamber 112 are detachably connected with each other.

In this embodiment, the processing unit 102 which is constituted of these processing units 103, 103' and 104, 104' and the transport unit 105 is roughly divided into an upper portion and a lower portion. That is, the processing unit 102 is divided into chamber portions where the inner pressure is reduced and a sample such as a semiconductor wafer which constitutes an object to be processed is handled and a frame 106 which is arranged below the chamber portions to support the chamber portions and in which equipment necessary for these chambers are arranged. Further, the above-mentioned processing unit is divided into the chamber portions which contain the processing chambers therein and a bed portion which houses the utilities which correspond to these processing chambers.

In this embodiment, the frame 106 is constituted of a center frame 204 which is arranged below the transport chamber 112 and four bed frames 205 which are arranged around the center frame 204. The center frame 204 is a support base which is arranged below the transport unit 105 or the transport chamber 112 and supports these parts and the processing units and the equipment which are connected to these parts. Accordingly, the center frame 204 is configured to have an approximately rectangular parallelepiped shape formed of beams to ensure the necessary strength. A space is formed in the inside of the center frame 204 and this space is used as a space for housing various pipes and lines necessary for the above-mentioned utilities and various processing units.

Further, the center frame 204 is arranged at a center side of the transport chamber 112. Particularly, in this embodiment, the center frame 204 is arranged to be positioned at the inside of a projection of the transport chamber 112 on a floor and bed frames 205 for respective processing units are arranged around the center frame 204. That is, four bed frames 205 having an approximately rectangular parallelepiped shape are arranged to face four sides or faces of the center frame 204 having an approximately rectangular parallelepiped shape with a suitable space defined between them. Here, the respective bed frames 205 are arranged to be inserted into a lower portion of the transport chamber 112 and are positioned on a projection surface of the transport chamber 112 on the floor so as to make the projection area of the processing block 102 more smaller.

In this embodiment, the bed portion is configured to have a bed frame and a bed which is housed and is arranged in the inside of the bed frame. The bed portion has an approximately rectangular parallelepiped shape and houses the utilities, a controller, a heat exchanger, and the like necessary for the upper chamber portion in the inside thereof. The bed frame has a strength large enough to support the chamber portion arranged above the bed frame and has a rectangular parallelepiped shape which is formed of beams. The bed is arrange inside the bed frame and a plate which covers the bed frame is arranged outside the bed frame.

As the utilities, for example, a power source for supplying electricity to a discharge pump for reducing the pressure inside the processing chamber, a temperature controller, respective sensor, and the like, a reservoir portion for gas which is supplied to a sample table to which the wafer which constitutes the sample is mounted and fixed inside a signal interface processing chamber for receiving and transmitting signals to be inputted to or outputted from the respective processing units and adjusting these signals, a reservoir portion for a refrigerant for cooling the sample table, a heat exchanger in a refrigerating cycle which exchanges and circulates a refrigerant and the like can be named.

The bed houses these utilities, while the bed is connected to the bed frame having an approximately rectangular parallelepiped shape and is housed therein. Further, in the inside of the bed frame 205 which constitutes the frame 106, an interface portion which is necessary for driving the respective utilities in the bed which houses the utilities is provided. The processing chamber portion is connected with respective sides of the transport chamber 112 using given connection gates. Further, the bed portions which correspond to the processing chamber portions are housed in the lower frame 106 of the transport chamber 112 and are connected with the apparatus body 100.

In this embodiment, the combination of the respective processing chambers and the bed portions which correspond to the processing chambers constitutes one processing unit. This one processing unit is collectively connected to the device body 100 or the transport unit 105 (transport chamber 112) in a detachable manner. Further, in one processing unit, the processing portion may have the corresponding lower bed portion thereof mounted or dismounted in a state that the processing portion is connected to the transport unit 105. Reversely, the bed portion may be mounted on or dismounted from the upper processing chamber portion in a state that the bed portion is connected to the frame 106.

Further, while the lock chamber 113 is arranged behind the atmospheric-pressure-side block 101 and between the block 101 and the processing block 102, a gap is formed between the frames 106 or between respective beds. On a back side of the block 101, a supply passage for gas, a refrigerant, a power source, and the like is formed. That is, a place where such a vacuum processing apparatus 100 is installed is typically an indoor such as a clean room where air is purified. Here, to install a plurality of vacuum processing apparatuses, it is a usual case that various gases, a refrigerant and a power source which are supplied to the device body 100 are, for example, collectively arranged on a floor different from a floor on which the apparatus bodies are installed and the various gases, the refrigerant and the power source are supplied by attaching conduit passages to respective apparatus bodies. In this embodiment, a connection interface 201 for conduit passages of gasses and refrigerant from a different place or supply lines such as electric lines from the power source is provided to a back surface portion of the atmospheric-pressure-side block.

Further, the atmospheric-pressure-side block 101 is connected to the supply passage of the respective utilities which are supplied to processing block 102 side at the connection interface portion 201. The supply of the conduit passages, the electric lines, and the like from the connection interface portion 201 is collectively arranged as a supply block 203, wherein the supply block 203 passes below the lock chamber 113 and below a center portion of the transport chamber 112 and is connected to the respective beds by way of interface portions provided to the respective bed frames 205 which constitute the frame 106. Further, some of gases and the like necessary for the processing pass a supply passage 204 which is arranged between the processing units 103, 104, above the control unit 107 and close to the control unit 107 and, thereafter, is connected to the control unit 107.

Conventionally, since the conduit passages and electric line and the like are attached such that the supply passage are led separately to the respective processing chambers from the supply source arranged on the separate floor and hence, to arrange and adjust the processing chambers or to exchange the processing chambers with processing chambers for other usage, the mounting and dismounting operation become cumbersome, thus deteriorating the operation efficiency. Further, display means such as a meter which adjusts the respective conduits and electric lines and displays a state of flow of the conduits and electric lines is provided for every processing chamber and hence, it is not easy for a user to determine the operation state of the apparatus. Further, since these conduit passages are attached around the respective processing chambers, the installation area required for the apparatus as a whole is substantially increased, thus giving rise to drawbacks that the number of apparatuses which can be installed on one floor is decreased or the spaces for operations are reduced so that the operation efficiency is lowered. In this embodiment, due to the above-mentioned constitution, it is possible to ensure the sufficient operation space and, at the same time, the confirmation of operation can be performed easily. Further, it is possible to reduce the installation space for the apparatuses.

That is, on the back surface portion of the casing 108, a display part 202 having the following constitution is arranged. That is, the display part 202 includes detection means which detects a state of respective supply lines which are connected to the processing blocks 102 side at the above-mentioned connection interface 201 and display means which displays a result of the detected output of the detection means so as to enable a user to easily detect the operation state of the apparatus. Further, the apparatus may be provided with adjustment means which can adjust the supply using these supply lines and or can input an instruction of adjustment.

Further, a gap is formed between the back surface of the casing 108 and the frame 106 of the processing block 102. This gap provides a space in which a user enters to perform operations on the processing unit 104, the transport chamber 112 and the lock chamber 113 and, at the same time, provides a space for confirming, adjusting or arranging the connection interface portion 201 and the display part 202 formed on the back surface of the casing 108. Further, in the space, means for displaying and adjusting information on the operation of the apparatus related to supplies from the supply lines are arranged in a concentrated manner. Accordingly, it is possible to easily perform the operations necessary for operating the apparatus and hence, the operation efficiency of the apparatus is enhanced.

Further, in this embodiment, the supply passages of utilities necessary for the respective units of the processing-side block 102 are collectively arranged. By collectively arranging the piping and connecting portions or interfaces of the electric connecting lines or the like led from other place such as a floor below the floor on which the device 100 is installed on a back surface of the casing 108 of the atmosphere block 101, in installing the apparatus body 100 on the floor or in arranging or exchanging the apparatus, the mounting operation, the connection operation or the dismounting operation of the supply passages can be facilitated whereby the operation efficiency is enhanced.

Further, in this embodiment, the supply line from the connection interface portion 201 which is formed of the conduit passages and the electric lines or the like is collectively arranged. The supply line passes below the lock chamber 113 and below the center portion of the transport chamber 112 and is connected to the respective beds by way of an interface portion which is arranged on the bed frame 205 which is arranged in a space below the transport chamber 112 and on the inner side of the center frame 204 and constitutes the frame 106. However, it may be possible that the respective conduit passages and electric lines of the supply line from the connection interface portion 201 are directly connected to the apparatus which is housed in the bed inside the frame 106.

That is, the respective units are arranged to surround the transport chamber 112, and the space in which the above-mentioned supply passage 20 is arranged is arranged on the inner side or on the center portion side of the apparatus. Such an arrangement space is arranged in a space defined below the transport chamber 112 and the lock chamber 113 and between the beds of the respective processing units. Accordingly, it is possible to ensure the space for performing the operations such as mounting, connecting or dismounting of the supply passage 203 and hence, the operations are facilitated whereby the operation efficiency is enhanced, thus leading to the enhancement of operation efficiency of the apparatus. Further, the connecting portion of the utilities is arranged on the inner side of the apparatus, that is, below the transport chamber 112. That is, the connecting portion is arranged to face the space between the respective beds and hence, the space for performing the above-mentioned operations is small whereby the installation area can be reduced compared to a case in which pipes, lines and connecting portions are arranged around the apparatus, thus increasing the number of the apparatuses which can be installed on the same floor area.

Figure 3A:
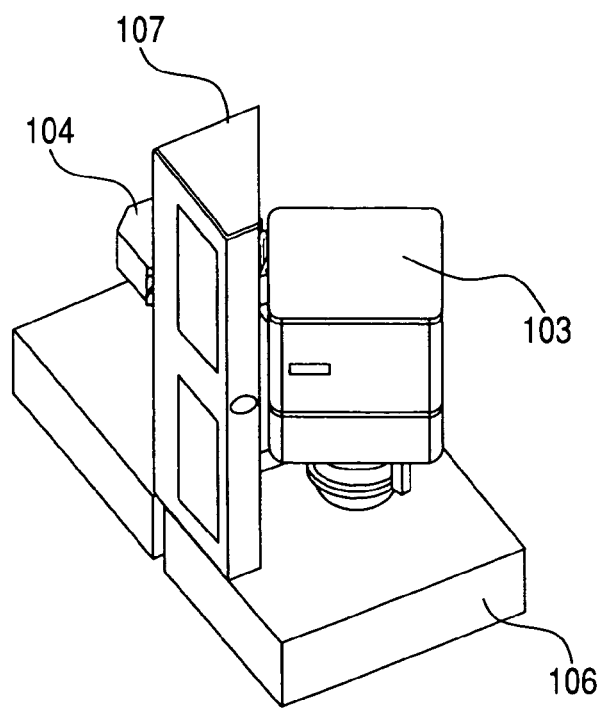
FIG. 3A is a perspective view showing the schematic constitution of respective units in an assembled state.
Figure 3B:
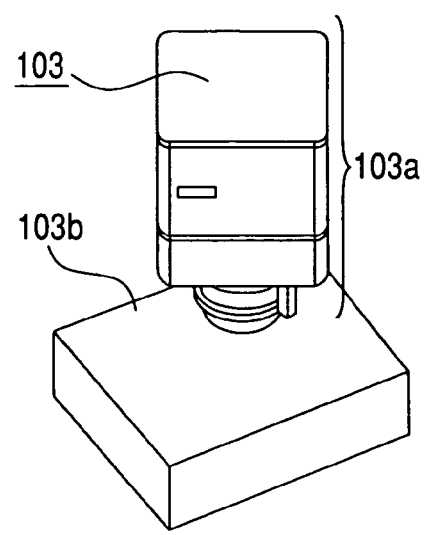
FIG. 3B is a perspective view showing the schematic constitution of respective units in a disassembled state.
Figure 3C:
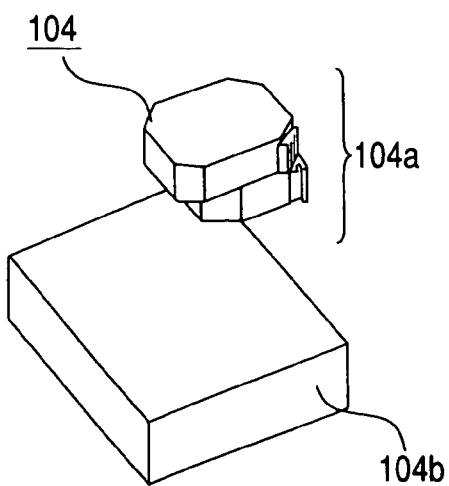
FIG. 3C is a perspective view showing the schematic constitution of respective units in a disassembled state.
Figure 3D:
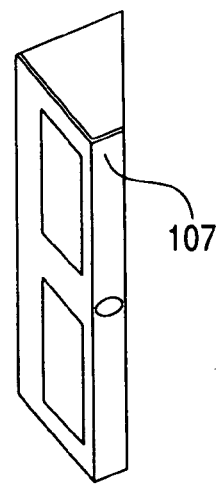
FIG. 3D is a perspective view showing the schematic constitution of respective units in a disassembled state.

FIGS. 3A to 3D are perspective views showing the schematic constitution of the respective units in this embodiment shown in FIGS. 1A and 1B, in which FIG. 3A shows the respective processing units which are arranged collectively. On the other hand, FIG. 3B, FIG. 3C, and FIG. 3D are views showing the respective units in a divided manner. FIG. 3B shows the etching processing unit 103, FIG. 3C shows the ashing processing unit 104, and FIG. 3D shows the control unit including a MFC (Mass Flow Controller).

As shown in these drawings, each processing unit 103, 104 includes the processing part 103a, 104a and the bed part 103b, 104b which is stored in and connected to the frame 106 at upper and lower portions thereof. Among these processing units, between the processing parts 103a, 103b of the etching processing unit 103, conduit passages and line passages for supplying the gas, the circulating refrigerant and the electricity are arranged so as to connect both of the processing parts 103a, 103b. On the other hand, the processing part 103a is supported on the bed by a plurality of support beams (not shown in the drawing) arranged on the frame 106. The control unit 107 is arranged between the etching processing unit 103 and the ashing processing unit 104, while the control unit 107 is arranged in a state that the control unit 107 is mounted on the frames 106 of the bed parts 103b, 104b of these processing units. The control unit 107 is a device which adjusts the supply of gas and the like which the processing units, arranged to sandwich the control unit 107 therebetween, require to the processing units. For example, in the inside of the control unit 107, a regulator which regulates the supply of gasses and electricity to the processing chamber arranged inside the processing part 103a of the etching processing unit 103 is arranged.

Figure 4:
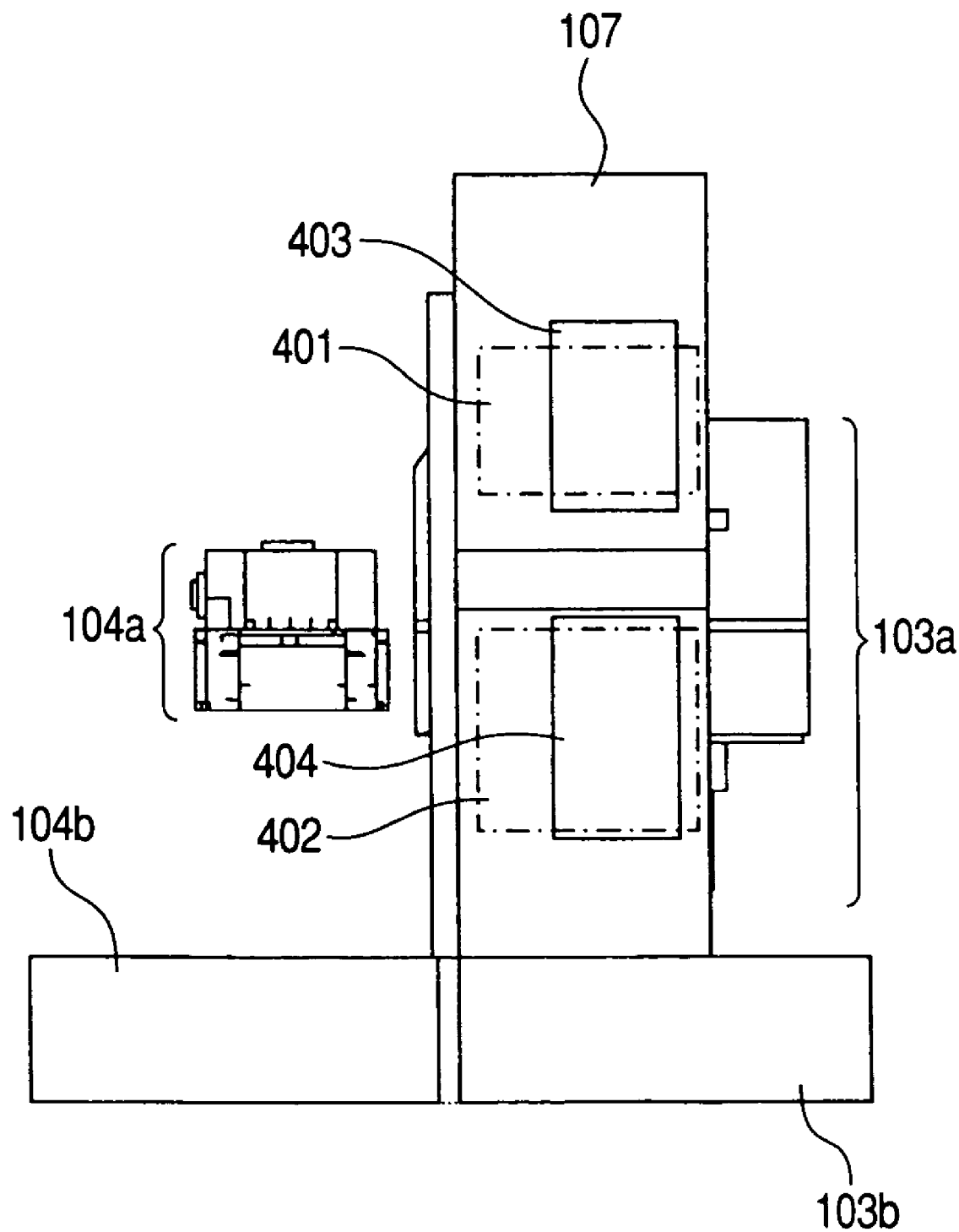
FIG. 4 is a side view which explains the positional relationship between a control unit and the respective processing units of one embodiment shown in FIGS. 1A and 1B.

FIG. 4 is a side view for explaining the positional relationship between the control unit 107 and the respective processing units in the embodiment shown in FIGS. 1A and 1B. The control unit 107 is positioned and arranged between the etching processing unit 103 which performs etching and the ashing processing unit 104 which performs ashing. In the inside of the control unit 107 as described above, the controllers 401, 402 for regulating the supply of the gasses and electricity to the respective processing units are provided.

In this embodiment, in the inside of the control unit 107, a plurality of flow rate regulators which regulate flow rates and speeds of processing gasses supplied to the etching processing unit 103 and the ashing processing unit 104, the gas and the refrigerant which are used for the temperature control of the sample in the inside of the processing chamber are arranged. Particularly, in the inside of the control unit 107, the flow rate regulator for etching processing unit is arranged at an upper portion thereof and the flow rate regulator for ashing processing unit is arranged at a lower portion thereof. Access doors 403, 404 which are opened or closed when necessary for arranging and exchanging devices including these flow rate regulators which are arranged in the inside of the control unit are arranged at upper and lower portions of the control unit 107. For controlling gasses and electricity to the respective processing units, the control unit 107 may be constituted by plural separated components of which each including a computer.

For example, in the inside of the control unit 107, reservoir portions for liquid such as refrigerant and water and gasses which are supplied to the processing chamber, valves for adjusting the flow of these fluids, and drive means such as motors for driving valves are stored and arranged. The regulator is provided for each processing chamber. This is because that the processing unit of this embodiment is configured to be detachable from the transport chamber 112 or the device body 100, wherein a plurality of processing units which can perform different processings are provided to one device body 100 to process the wafer which constitutes the sample. Accordingly, by preparing the processing units having different specifications with respect to different processings and by exchanging the processing units, the versatile processings can be performed using one apparatus. Since it is possible to realize the conditions and the operations of the apparatus for optimum processing corresponding to the processing units having different specifications for processing such as different kinds of gasses and different temperatures and the like, it is desirable to independently regulate the respective processing units.

In such a vacuum processing device, the control units 107, 107' of this embodiment are arranged between two processing units and are configured to establish the easy connection with the respective units. Accordingly, mounting and dismounting operations of the processing units and the control units are facilitated and hence, the operation time can be shortened.

Further, equipment which correspond to the respective processing units in the inside of the control units 107, 107' are arranged vertically so that a space necessary for the arrangement can be decreased. By effectively making use of the space between the processing units, the distance between the processing units can be shortened and hence, the installation area of the whole device can be decreased. Further, the difference in the flow passage length of the fluid supplied to the respective processing chambers can be easily decreased. Accordingly, it is possible to suppress the difference in the flow passage length to the processing chambers before and after the exchange or the change of the processing units or processing chamber portions. In this manner, when mounting or dismounting of the processing units is performed in the form of the arrangement or the exchange of the processing units or mounting of an additional unit, it is possible to suppress the occurrence of the difference in performance before and after the mounting or the dismounting whereby, it is easy for a user to perform the regulation using the control unit 107 and, at the same time, a yield rate of the whole device can be enhanced.

Figure 10:
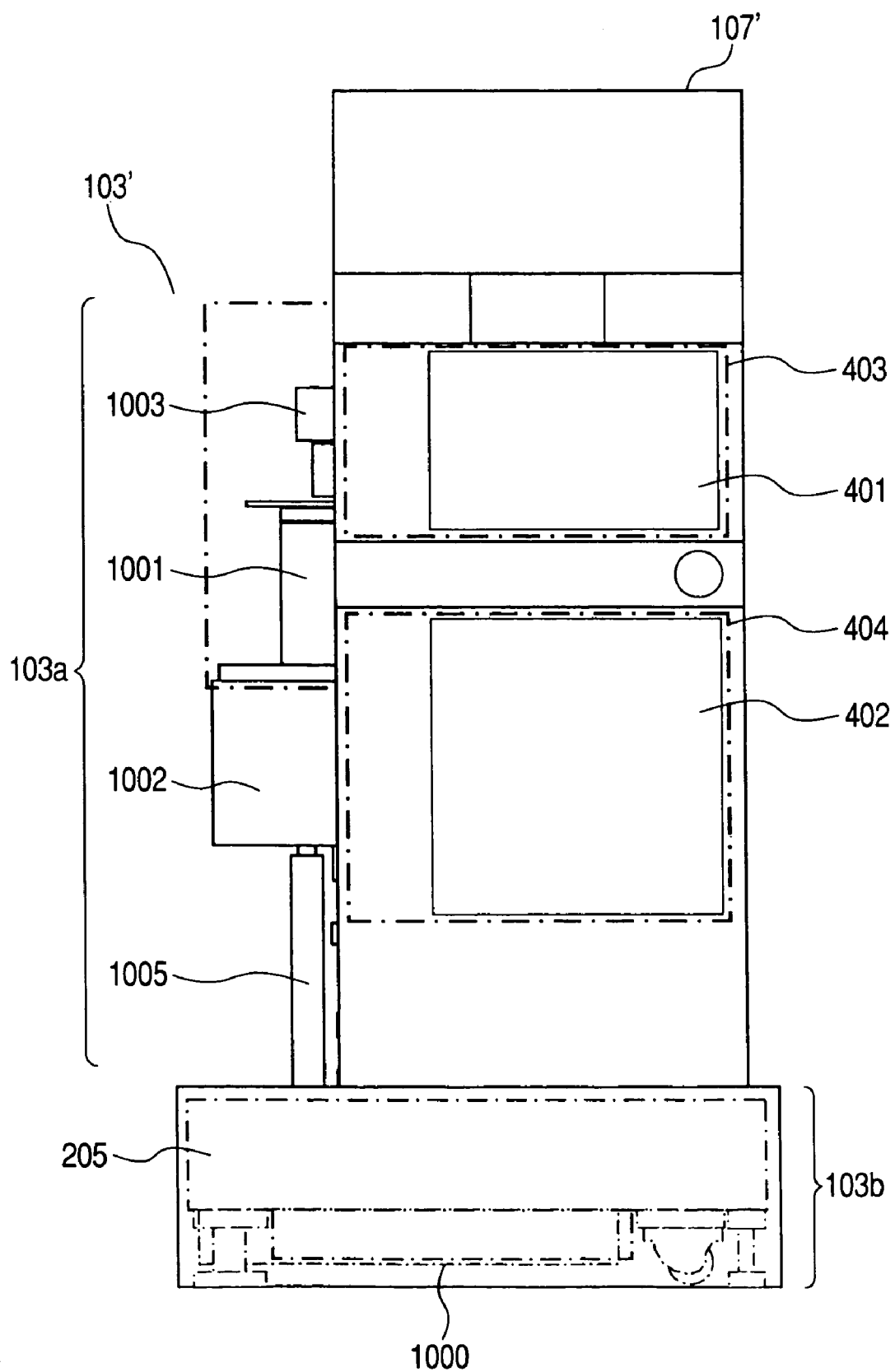
FIG. 10 is a view showing the schematic constitution of an etching processing unit of the vacuum processing apparatus shown in FIGS. 1A and 1B.
Figure 11:
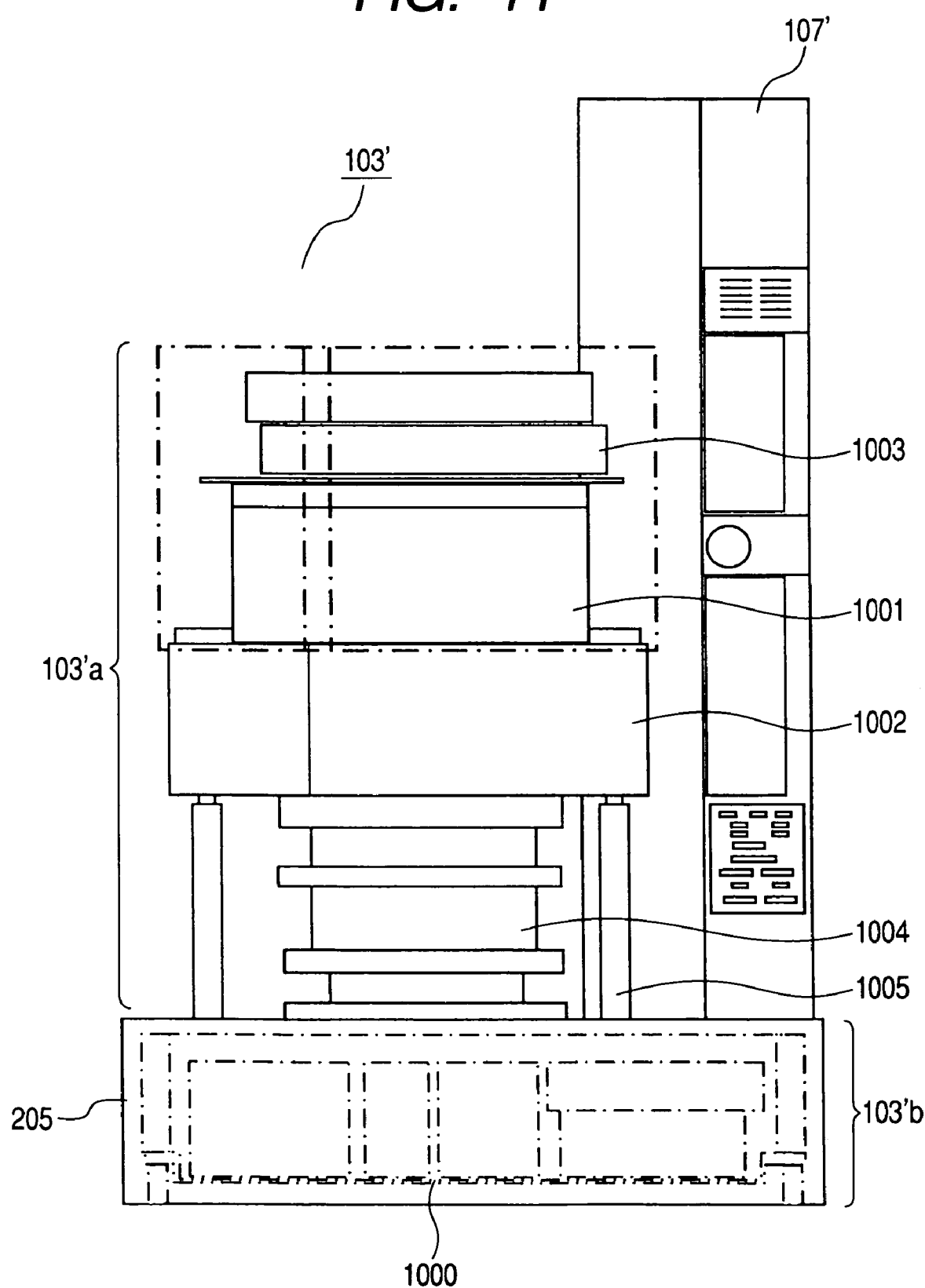
FIG. 11 is a view showing a side surface of the processing unit shown in FIG. 10.

The constitution of the etching processing unit is explained in detail in conjunction with FIG. 10 and FIG. 11. FIG. 10 is the view showing the schematic constitution of the etching processing unit of the vacuum processing device shown in FIGS. 1A and 1B. FIG. 11 is a view showing a side surface of the processing unit shown in FIG. 10.

In these drawings, a processing chamber portion 103'a which constitutes an upper portion of the etching processing unit 103' includes a discharge chamber portion 1001, a vacuum chamber portion 1002, an electric wave source portion 1003 and a gas discharge portion 1004. Here, in the discharge chamber portion 1001 provided with the discharge chamber, the inner pressure is reduced, and eradiated electro magnetic waves are introduced to form plasma therein. The vacuum chamber portion 1002 is arranged below the discharge chamber portion 1001 and is communicated with the discharge chamber, wherein in the same manner as the discharge chamber portion 1001, the inner pressure is reduced and the plasma formed in the inside of the discharge chamber and a reaction product and gasses are made to flow thereinto from the discharge chamber. The electric wave source portion 1003 is arranged above the discharge chamber portion 1001 and an electromagnetic wave generator which becomes an electric wave source of the electromagnetic waves introduced into the discharge chamber is arranged in the electric wave source portion 1003. The exhaust portion 1004 is arranged below the vacuum chamber portion and is communicated with the inside of the vacuum chamber so as to discharge the plasma, the reaction products, and the like in the vacuum chamber. Further, an exhaust pump which reduces the pressure in the vacuum chamber and the discharge chamber is arranged in the exhaust portion 1004. Further, below the vacuum chamber portion 1002, support beams 1005 which are connected with the bed portion 103'b and support the vacuum chamber portion 1002 are provided. Here, the discharge chamber portion 1001, the vacuum chamber portion 1002 and the electric wave source portion 1003 may be covered with a cover which is indicated by a doted line. A connecting portion having an opening for transporting the sample between the discharge chamber portion 1001 or the vacuum chamber portion 1002 and the transport chamber 112 is also provided to the processing chamber portion 103'a.

Further, the bed portion 103'b which is arranged below the processing chamber portion 103'a includes a bed frame 205 and a bed 1000 which is arranged in the inside of the bed frame 205. Further, above the bed portion 103'b, the control unit 107' is arranged close to the processing chamber portion 103'a. As described above, the control unit 107' is provided with the flow rate regulator 404' which regulates the flow of the fluid such as gas, refrigerant or the like to be supplied to the processing chamber portion 103'a, the discharge chamber portion 1001 or the vacuum chamber portion 1002 in the inside thereof and, at the same time, the control unit 107' is provided with the flow rate regulator 403' for the ashing processing unit 104' (shown in FIGS. 1A, 1B, 2A, and 2B) and the access doors 402', 401' for performing the regulation and the maintenance operation of these parts.

Further, although not shown in the drawing, the control unit 107' includes a lifting device such as a crane or a lifter which vertically moves the vacuum chamber portion 1002 and the electric wave source portion 1003 of the processing chamber portion 103'a by lifting or lowering the devices while holding the devices so as to open the inside of these devices, thus facilitating the maintenance and the inspection operation of these devices. Accordingly, the control unit 107' includes a frame having a strength necessary for supporting and holding these devices mounted in the inside of the control unit 107'. Further, the above-mentioned flow rate regulators 403', 404' are arranged in the inside of the frame and the outside of the flow-rate regulators 403', 404' are covered with plates and access doors 401', 402'.

The bed 1000 is mounted on the bed frame 205 which constitutes the bed portion 103'b and utilities are arranged in the inside of the bed 1000. The detail of such constitution is explained in conjunction with FIGS. 12A, 12B and FIGS. 13A, 13B hereinafter.

Figure 12A:
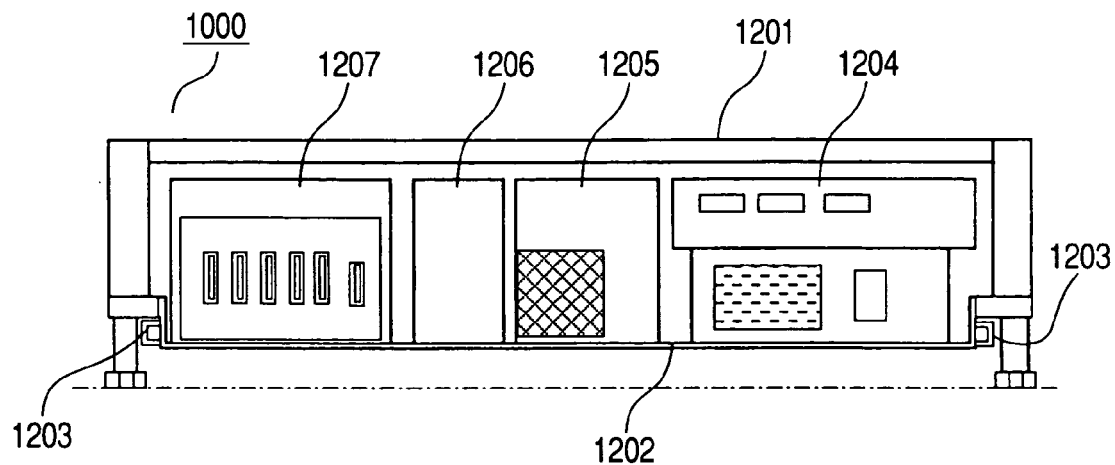
FIG. 12A is a side view showing a bed shown in FIG. 10 as viewed from a position outside and behind the vacuum processing apparatus of this embodiment.
Figure 12B:
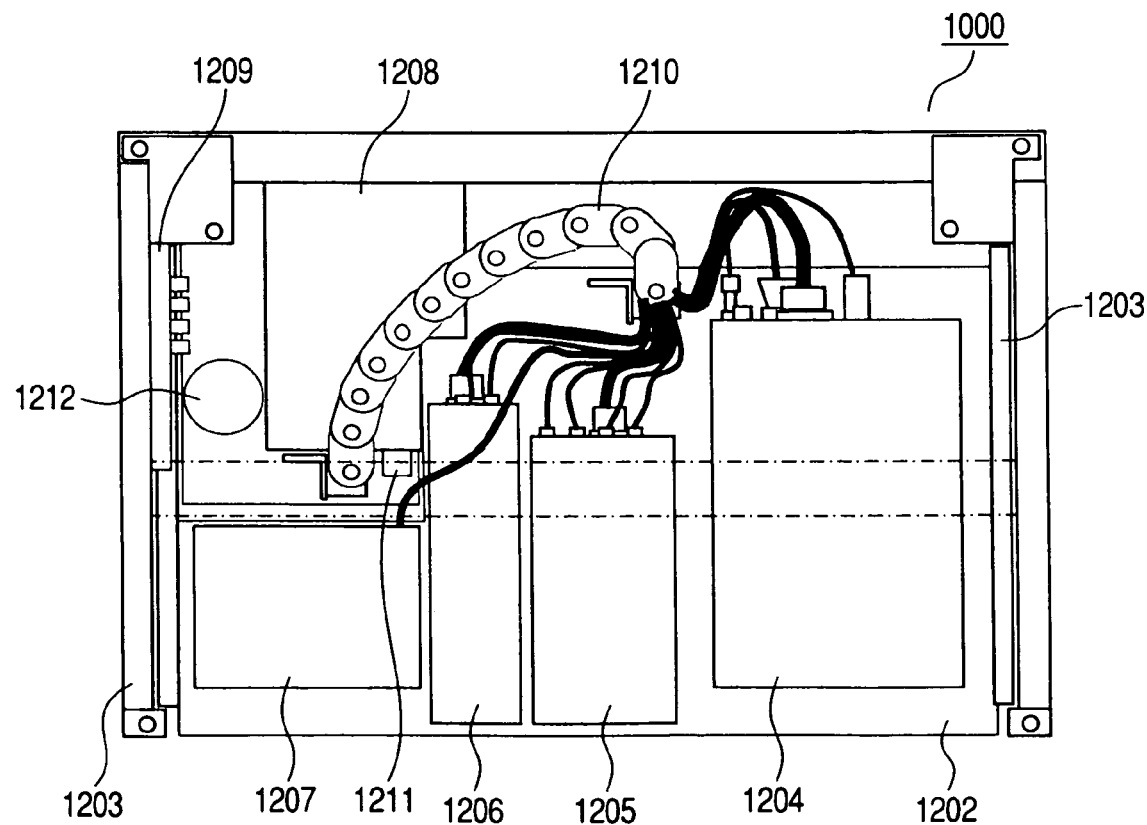
FIG. 12B is a side view showing a bed shown in FIG. 10 as viewed from a position outside and above the vacuum processing apparatus of this embodiment.
Figure 13A:
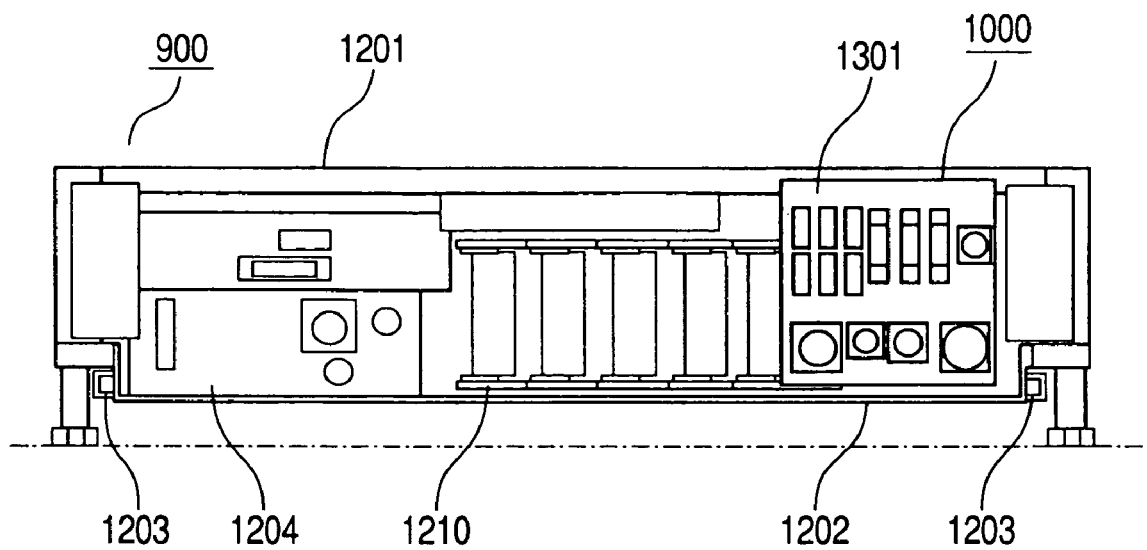
FIG. 13A is a side view showing a bed shown in FIG. 10 as viewed from a position inside the vacuum processing apparatus of this embodiment.
Figure 13B:
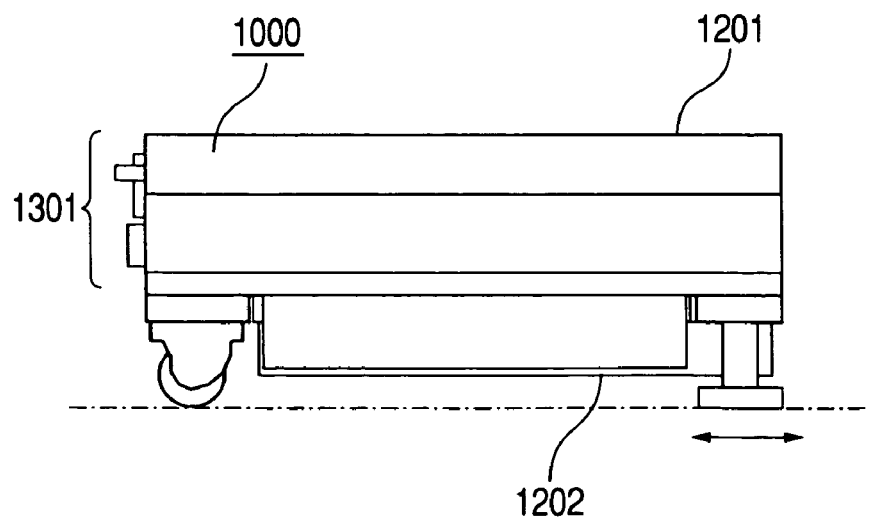
FIG. 13B is a side view showing a bed shown in FIG. 10 as viewed from a position outside and a side of the vacuum processing apparatus of this embodiment.

FIG. 12A and FIG. 12B are explanatory views of the bed shown in FIG. 10, wherein FIG. 12A is a side view as viewed from a position outside and behind the vacuum processing apparatus of this embodiment and FIG. 12B is a plan view as viewed from above the vacuum processing apparatus of this embodiment. FIG. 13A and FIG. 13B are explanatory views of the bed shown in FIG. 10, wherein FIG. 13A is a side view as viewed from the inside of the vacuum processing apparatus of this embodiment and FIG. 13B is a side view as viewed from the outside and the side of the vacuum processing apparatus of this embodiment.

In these drawings, the bed portion 103'b has support beams 1201 which constitute the bed frame 205 and is formed in an approximately rectangular parallelepiped shape. The support beams 1201 hold the bed 1000 and, at the same time, the above-mentioned support beams 1005 and the control units 107' are connected to support the bed 1000. Accordingly, the bed 1000 has the sufficient strength. Further, a metal-made plate is mounted on the periphery of the support beams 1201 to cover the inside of the support beams 1201, thus forming an approximately rectangular parallelepiped surface of the bed portion 103'b. With the use of this plate, the upper surface of the bed portion 103'b constitutes a flat surface and an operator can ride on the upper surface when necessary. Accordingly, it is possible to use the space around the processing chamber portion 103'a as a space for maintenance whereby the efficiency of the operation is enhanced and, at the same time, the installation area of the device can be further reduced.

Further, to members which constitute the support beams 1201, a drawer 1202 which stores the utilities arranged in the inside of the bed 1000 and rails 1203, which movably and substantially horizontally support the drawer 1202 between the outer side and the inner side of the bed portion 103'b, are mounted. Accordingly, the utilities are stored in the inside of the bed portion 103' in a usual operation and the utilities can be moved to the outside of the bed portion 103'b or the apparatus 100 when necessary. For example, at the time of performing the maintenance, the exchange or the regulation of the power source device included in the utilities, for example, the user can easily get access to these devices. Accordingly, the operation is facilitated, the operation time is shortened, and the use efficiency of the space for operation can be enhanced.

In this embodiment, these utilities are power source devices 1204, 1205, 1206 which supply electricity to the respective devices provided to the processing chamber portion 103'a and a regulation device 1207 which regulates this supply of electricity. The drawer 1202 is supported on the rails 1203 and is movable along the rails 1203 and, at the same time, the drawer 1202 is configured to be removable from the rails 1203, the support beams 1201 or the bed frame 205, and may be exchanged with a separately prepared drawer.

Further, as mentioned above, with respect to the bed frame 205, on a portion thereof which faces the inside of the device 100 or the space below the transport chamber 112 and facing to spaces between the beds, or on a side thereof which faces the center frame 204, an interface portion 1301 which connects lines and pipes of a collective formed supply block 203 and the utilities in the inside of the bed 1000 is mounted. The devices inside the bed and the devices outside the bed are connected to each other using this interface portion 1301. Further, the interface portion 1301 is offset to either one side in the horizontal direction with respect to the bed portion 103'b or the bed frame 205 and mounted and fixed to either one of the bed portion 103'b and the bed frame 205. Namely, when it sees the processing unit which performs etching processing, looks at the whole apparatus from the upper part, the processing unit 103, 103, which has the processing chamber portions 103a, 103'a and the bed portions 103b and 103'b corresponding to the processing chamber portions, are arranged symmetrically about the line which passes along center portion of the transport chamber 112. Interfaces 1301 and 1301' are arranged in the bed board 103b and 103'b, inclined toward inside (center side) portion of the apparatus. These interfaces are faced to a space under the center frame 204 located lower part of the transport chamber 112.

The interface portion 1301 functions as a window opening between the utilities such as the power source portions 1204 to 1206, the regulator 1207, and the like in the inside of the bed 1000 and the device body, and at the same time, functions as a regulator which regulates the connection between these devices. In the interface portion 1301, connectors which transmit and receive electricity supplied to the power source parts 1204 to 1206 and data signals and control command signals between the processing chamber portion 103'a and the device body 100, and connectors which perform the connection between pipes from reservoir portions of fluids such gas, the refrigerant, and the like which are arranged in the inside of the bed 1000 and the pipes in the inside of the collective supply block 203 of the apparatus body 100 are arranged.

The utilities such as the power sources 1204 to 1206 and the like which are arranged in the inside of the drawer 1202 provided to the bed 1000 are fixed to the drawer 1202 such that the utilities are moved along with the movement of the drawer 1202 in the approximately horizontal direction. Accordingly, to maintain the connection between the utilities and the bed frame 1205 side is ensured along with the movement of the drawer 1202, the lines are collectively stored and arranged in an extension connection tube 1210. Further, to the inside of the bed of the interface portion 1301, a regulation device 1208 which regulates inputting and outputting of signals and electricity which are transmitted and received through the interface portion 1301 is arranged, while the power sources 1204 to 1206 and the power source regulator 1207 are connected with each other through the input/output regulation device 1208.

One end of the extension connection tube 1210 is fixed to the drawer 1201 and the lines which pass through the extension connection tube 1210 are pulled out and are connected with the respective utilities arranged in the inside of the drawer 1202. Another end of the extension connection tube 1210 is fixed to the bed frame 1205 side of the bed 1000. Particularly, another end of the extension connection tube 1210 is connected to the regulation device 1208 and the inner line is connected to the regulation device 1208. To allow the extension connection tube 1210 to be extended or bended along with the movement of the drawer 1202, the extension connection tube 1210 is constituted of a plurality of contiguous neighboring tubes which are connected by way of a plurality of intermediate portions. When the drawer 1202 is pulled out, the plurality of tubes are connected such that the tubes are extended so as to connect the drawer 1202 and the regulation device 1208 side. Then, when the drawer 1202 is stored, the drawer 1202 and the regulation device 1208 side are connected with each other in a state that the extension connection tube 1210 is bent using joint portions as fulcrums. Due to such a constitution, at the time of performing the operations such as maintenance, inspection, mounting, dismounting of the utilities, it is possible to collectively handle the wiring portion by removing the extension connection tube 1210 and hence, the operation such as mounting and dismounting of the utilities to and from the bed 1000 and the establishment/termination of connection can be performed easily.

Further, in this embodiment, the utilities are also arranged on immovable portions which are fixed to the bed frame 205. These utilities are arranged corresponding to the frequency of the maintenance, inspection and connection operations or the presence or non-presence of the connection. In the above-mentioned interface portion 1301, connectors relevant to the utilities which are not arranged in the inside of the drawer 1202 and are not movable with the drawer 1202 are arranged. As such utilities, for example, an input/output switch portion 1209 which turns on and off the connection of paths of the electricity and signal lines and a reservoir portion 121 for gas and refrigerant are named. These utilities are arranged on the bed frame 205 per se or a planar fixed mounting plate 1202' mounted on the bed frame 205.

This embodiment is provided with a switch 1211 which can supply the electricity to the bed portion 103'b and all signals altogether or to some designated portions at the time of performing the operations such as the removal of the bed portion 103'b, the bed 1000 and the drawer 1202 and the maintenance, the inspection, and the like of the processing chamber portion 103'a. Due to the manipulation of the switch 1211, it is possible to turn on/off the electricity and signals supplied to the processing chamber portion 103'a and hence, it is possible to turn on/off the operation of whole processing unit or the operation of some particular portions. By manipulating such a switch, the time required for the maintenance and inspection operation can be shortened and the operations become easy. Further, the accuracy of the operation is enhanced and the safety of the operation is also enhanced. In this embodiment, the switch 1211 is arranged on the inner surface of the bed 1000 of the input/output regulation device 1208 and hence, by pulling out the drawer 1202, the user can easily get access to the switch 1211 and can manipulate the switch 1211.

Further, the switch 1211 may be provided to the interface portion 1301. The interface portion 1301 is a portion which the user uses when the user mounts or dismounts the bed portion 103'b, mounts or dismounts the utilities or when the user performs the maintenance and inspection operation. Accordingly, by arranging the switch 1209 as close as possible to the user, the user can easily recognize the necessity of the manipulation of the switch whereby the safety and the efficiency of the operation is enhanced.

Figure 14:
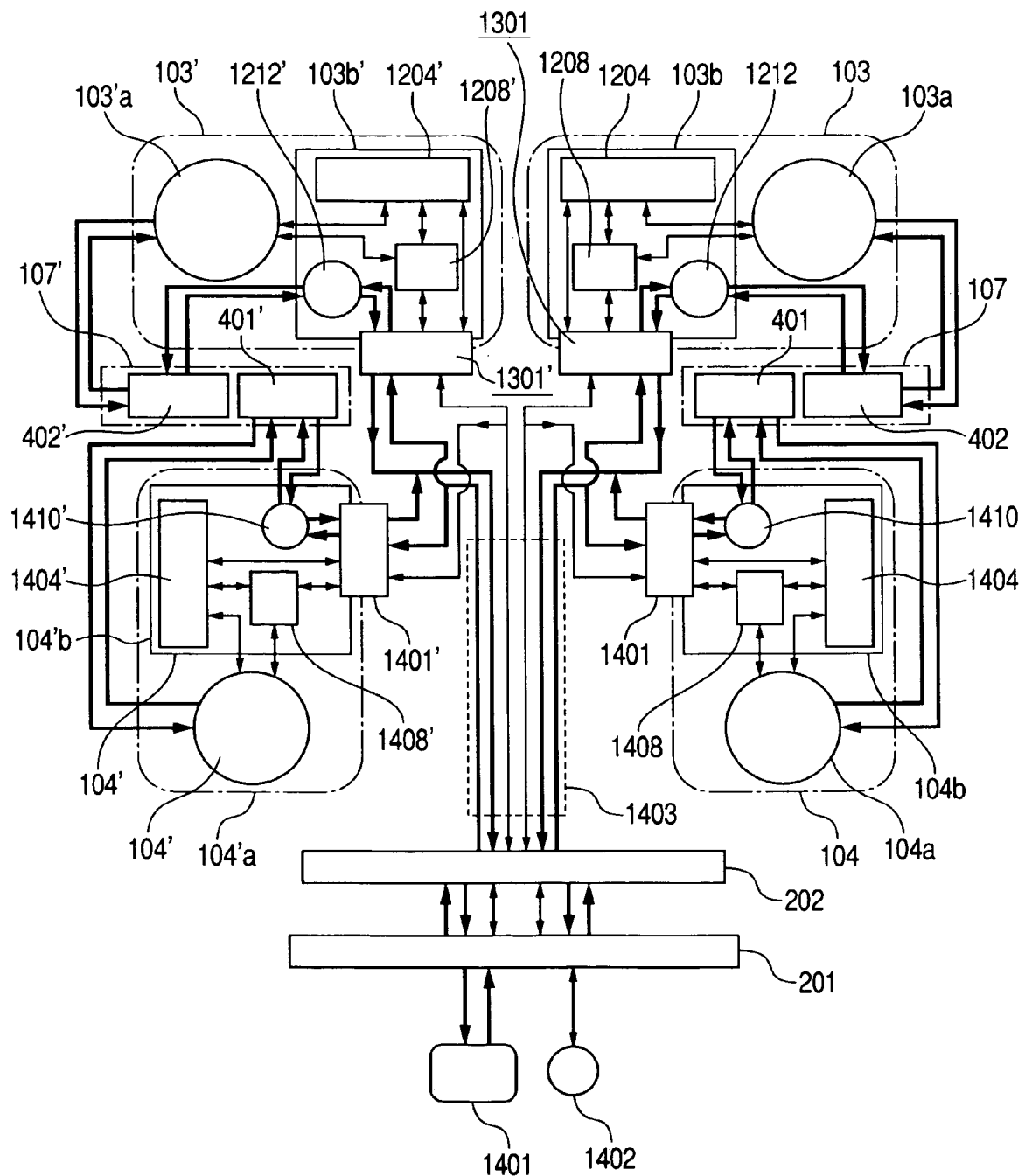
FIG. 14 is a schematic view showing the flow of signals and fluid in the embodiment shown in FIGS. 1A and 1B.

FIG. 14 shows the summary of the connection of the lines such as the lines of the signals, electricity, and the like of the embodiment and pipes of gas or the heat exchanger medium. FIG. 14 is a schematic view showing the flow of signals and fluids in the embodiment shown in FIGS. 1A and 1B. Particularly, FIG. 14 is a view showing a state in which the processing block 102 is viewed from above and shows the schematic connection of lines and pipes in respective units. In the connection of the lines and pipes, the signals, the electricity and the fluids such as gases and the heat exchanging medium or the like are transmitted from a power source portion 1401 and a reservoir portion 1402 constituting a fluid source in which gases and a heat exchange medium is stored which are arranged underfloor where the apparatus 100 is installed to the respective processing units of the processing block 102 through the connection interface 202 and the display part 202 arranged in the device 100. Further, the lines and the pipes are arranged to pass the display part 202 and, thereafter, pass the center side (inner side) of the processing block around which the respective processing units are arranged, wherein the respective one ends of the lines and the pipes are connected to the respective processing units.

That is, the lines and the pipes from the display part 202 are collectively arranged in an arrangement space 1403 for pipes and lines which is arranged below the transport unit 105 including the lock chamber and the transport chamber 112 and below the inner side of the base frame 204 which supports the transport unit 105. The respective lines and pipes which are arranged in the inside of the arrangement space 1403 are connected to the respective processing units at the interface portions of the respective bed portions which are arranged below the respective processing units arranged around the side surface portions of the base frame 204 having an approximately rectangular parallelepiped shape.

With respect to the lines and the pipes which are arranged in the inside of the arrangement space 1403, the supply and return pipes for the processing units arranged on the left side and the right side of the processing block 102 and the lines for signals and electricity for these processing units are respectively provided for the right-side use and the left-side use respectively, and these pipes and the lines are collectively arranged. The supply pipes is branched for the etching processing unit 103 and the ashing processing unit 104 at the outside of the processing-unit-side outlet of the arrangement space 1403 and the pipes are arranged for respective processing units. The return pipes are reversely connected such that the fluid which flows in the pipes for respective processing units are merged and the merged fluid flows in the inside of the arrangement space 1403. On the other hand, the lines for a plurality of processing units which are collectively assembled in one unit in the arrangement space 1403 are separated outside the arrangement space for every processing unit.

The pipes after branching is connected with the interface portions of the respective processing units. For example, the pipes after branching are connected to the interface portion 1301 of the bed portion 103*b* of the right-side etching processing unit 103 and the interface portion 1401 of the bed portion 104*b* of the ashing processing unit 104. In the bed portion 103*b* of the etching processing unit 103, the pipes which is connected to the interface portion 1301, which is arranged in an offset manner toward the surface of the lower portion of the transport chamber 112 and which is arranged at a position which faces the base frame 204, is connected to the reservoir portion 1212 which is arranged at a portion fixed to the bed 1000 in the inside of the bed portion 103*b*. The pipes started from the reservoir portion 1212 is connected to the controller 402 which is mounted in the inside of the control unit 107 arranged above the bed portion 103*b*. The fluid is supplied to the processing chamber portion 103*a* of the etching processing unit 103 from the controller 402.

Further, among the lines which are connected to the interface portion 1301 of the etching processing unit 103, some lines are connected to the utilities represented by the power source device 1204 and other lines are connected to the utilities such as the power source device 1204 by way of the regulation device 1208. Further, the line from the regulation device 1208 is directly connected with the processing chamber portion 103*a* directly by way of the regulation device 1208, while another line is connected to the processing chamber portion 103*a* by way of the power source device 1204.

On the other hand, in the bed portion 104*b* of the ashing processing unit 104, the pipes which is connected to the interface portion 1401 which is arranged in the offset manner toward the lower portion of the transport chamber 112 and which is arranged at a position which faces the base frame 204, is connected to the reservoir portion 1412 which is arranged at a portion fixed to the bed 1000 in the inside of the bed portion 104*b*. The pipes started from the reservoir portion 1412 is connected to the controller 401 which is mounted in the inside of the control unit 107 arranged above the bed portion 104*b*. The fluid is supplied to the processing chamber portion 104*a* of the ashing processing unit 104 from the controller 402.

Further, some lines which are connected to the interface portion 1401 of the ashing processing unit 104 are, in the same manner as the etching processing unit 103, connected to the utilities represented by the power source device 1404 and other lines are connected to the utilities such as the power source device 1404 by way of the regulation device 1408. Further, the line from the regulation device 1408 is directly connected with the processing chamber portion 104*a* directly by way of the regulation device 1408, while another line is connected to the processing chamber portion 104*a* byway of the power source device 1404.

The interface portion 1301 of this embodiment is arranged on the transport chamber side of the bed portion having an approximately rectangular parallelepiped shape or on the surface which faces the center side of the transport chamber. The interface portion 1301 is particularly arranged in an offset manner to either one of the left and the right, and also is arranged at a position close to the center side or the inside of the transport chamber. Namely, the interface portion 1301 is located in a position where faced to the space below the transport chamber 112. Further, when the bed portions having an approximately rectangular parallelepiped shape are arranged such that their faces face each other in an opposed manner, the interface portions of these bed portions are arranged close to each other. Due to such a constitution, it is possible to collectively perform the mounting and dismounting operations of the pipes and lines at the interface portion and hence, the efficiency of the operation is enhanced. Further, the bed portions can be arranged closer to each other so that the installation area of the whole device can be reduced and, at the same time, it is possible to secure a wider footing on which an operator ride and can more reliably perform the operation below the processing unit.

Further, since it is possible to perform the operation by pulling out the device in the inside of the bed portion only when necessary, the operation space required around the device can be suppressed whereby it is possible to reduce the installation area of the device and to enhance the installation efficiency.

Figure 5A:
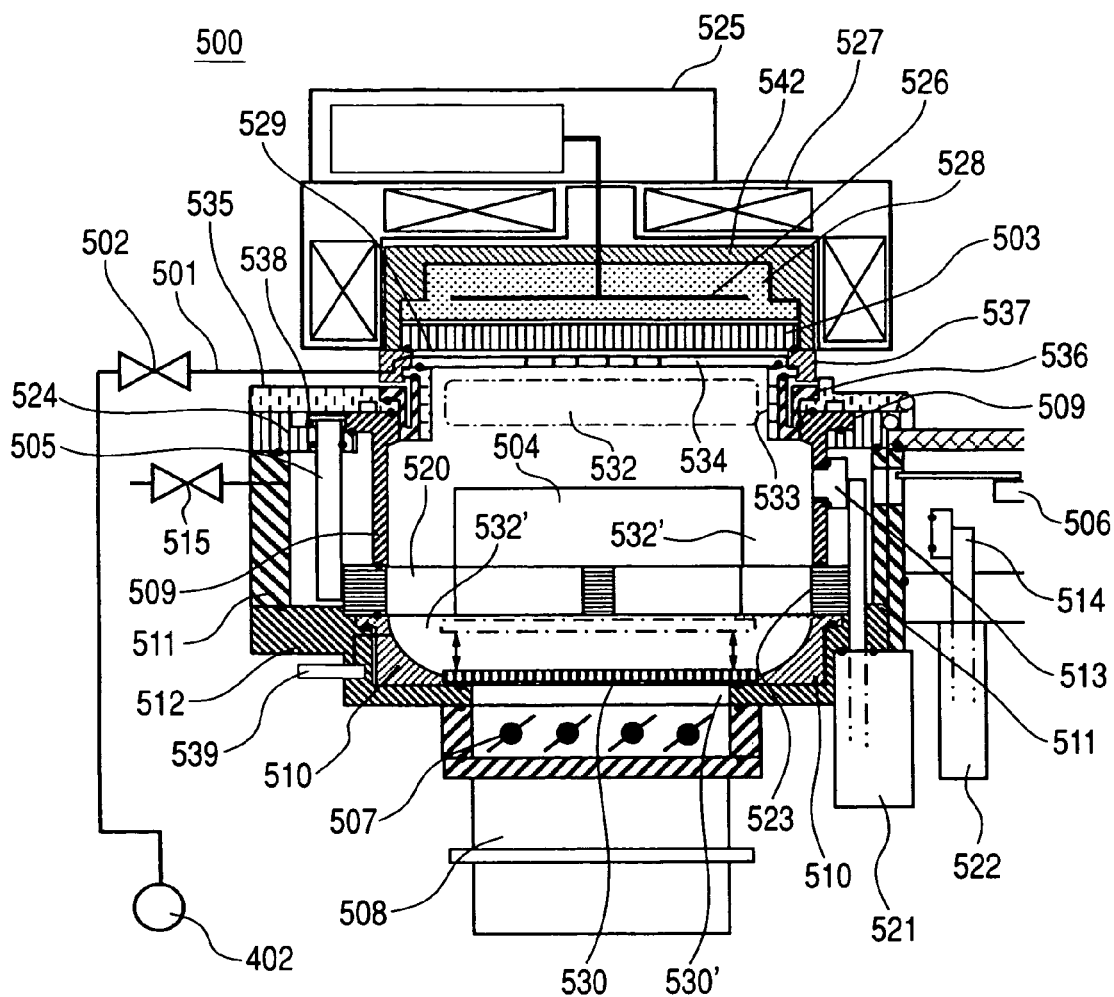
FIG. 5A is a longitudinal cross-sectional view showing the schematic constitution of a processing chamber portion of the processing unit among the processing units shown in FIGS. 1A and 1B.
Figure 5B:
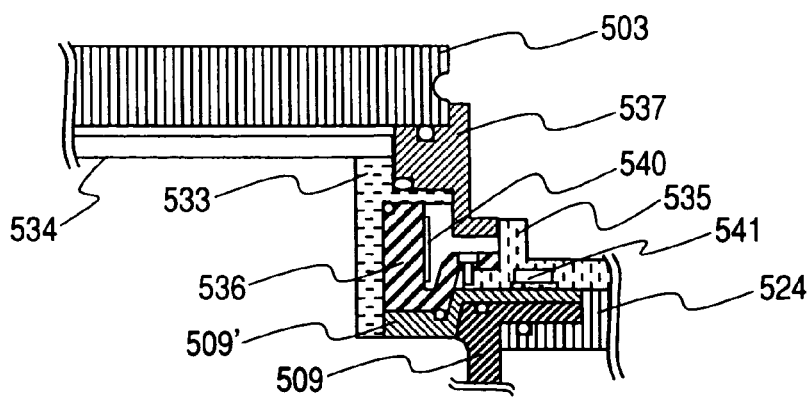
FIG. 5B is a longitudinal cross-sectional view showing the constitution of a connection portion between a discharge chamber portion and a vacuum chamber portion of the embodiment shown in FIG. 5A.
Figure 6:
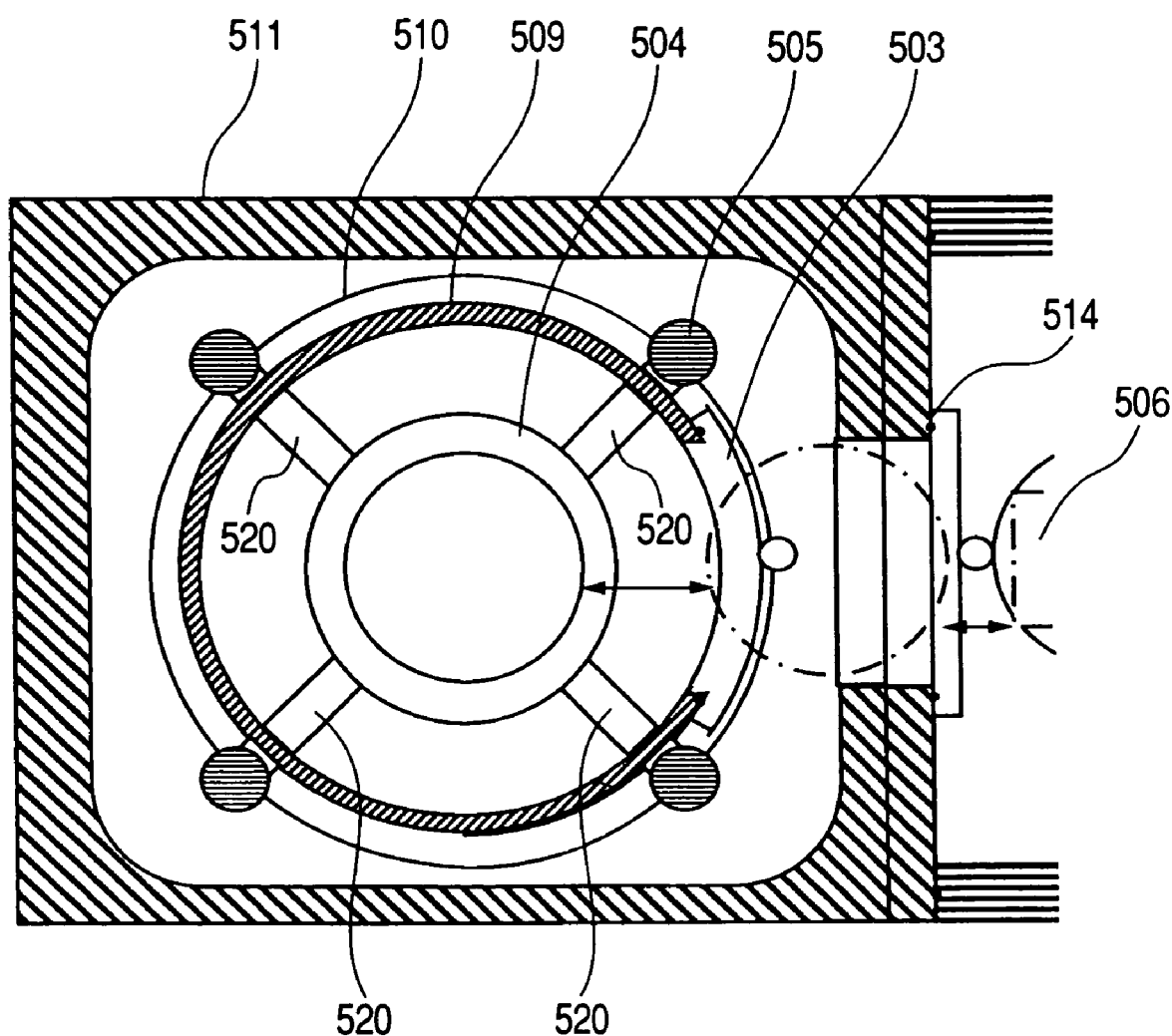
FIG. 6 is a transverse cross-sectional view showing the schematic constitution of the processing chamber portion of the processing unit shown in FIGS. 5A and 5B.

Next, the constitution of the processing unit of this embodiment is explained in detail in conjunction with FIG. 5A to FIG. 9. First of all, the characterizing constitution of the processing unit is explained in conjunction with FIGS. 5A, 5B, and FIG. 6. FIG. 5A is a longitudinal cross-sectional view showing the schematic constitution of the processing chamber portion of the processing unit shown in FIGS. 1A and 1B. FIG. 6 is a transverse cross-sectional view showing the schematic constitution of the processing chamber portion of the processing unit shown in FIG. 5A. FIG. 6: particularly shows the constitution of the processing chamber portion of the etching processing unit 103.

In the drawing, the processing chamber portion 500 which constitutes the upper portion of the processing chamber portion 103*a* is connected to the transport chamber 112, wherein the communication between the processing chamber portion 500 and the transport chamber 112 is established or interrupted by an open/close atmospheric gate valve 514 which is arranged between the processing chamber portion 500 and the transport chamber 112. In a state that the atmospheric gate valve 514 is opened, a space inside the transport chamber 112 and a space inside the processing chamber portion 500 are communicated with each other so that the pressures of both spaces become substantially equal. When the atmospheric gate valve 514 is opened, the wafer which constitutes the sample is transported to the sample stand 504 which is arranged in the inside of the processing chamber portion from the inside of the transport chamber 112.

In this embodiment, after detecting and confirming that the sample is placed on the sample stand 504, the atmospheric gate valve 514 is closed to interrupt the communication between the inside of the processing chamber portion 500 and the transport chamber 112 and hence, the processing is started after sealing the inside of the processing chamber portion. To remove the processing chamber portion 500 from the transport chamber 112 or to perform the maintenance operation, the atmospheric gate valve 514 is set to a closed state, the pressure inside the processing chamber portion 500 is elevated to the atmospheric pressure and, thereafter, the inside of the outer chambers 511, 512 which form a vacuum container of the processing chamber portion 500 is opened and exposed to the atmosphere.

As shown in the drawing, a discharge chamber portion 1001 is arranged in the upper portion of the processing chamber 500. Here, the discharge chamber portion 1001 includes a lid member 542 which constitutes a lid of the vacuum container, an antenna member which is arranged inside the lid member 542, a magnetic field generating portion which is arranged on the side of and above the antenna member in a state that the magnetic field generating portion surrounds the discharge chamber portion, and a ceiling member which is arranged below the antenna member. Further, above the magnetic field generating portion, an electric wave source portion 525 which supplies electric waves of a UHF band and VHF band which the antenna member emits is arranged. The antenna member includes an antenna 526 having a planar shape which is constituted of a conductive member made of stainless steel or the like and is arranged in the inside of the lid member 542 and at least one dielectric 528 having a ring shape which is arranged between the antenna 526 and the lid member 542 to insulate these elements from each other and to transmit the electric waves emitted from the antenna 526 to the lower ceiling member side.

Further, the ceiling member includes a (quartz) plate 503 and a shower plate 534 which is arranged below the quartz plate 503. Here, the quartz plate 503 is formed of a dielectric made of quartz or the like for transferring the transmitted electric waves to the inside of the lower processing chamber side. The shower plate 534 is provided with a plurality of holes therein and these holes are formed for introducing a supplied process gas for processing into the inside of the processing chamber in a dispersed manner.

A space which is formed below the shower plate 534 and above a sample stand 504 defines a discharge chamber 532 in which plasma is generated due to an interaction of the electric waves which are introduced into the supplied processed gas through the quartz plate 503 and the magnetic field supplied from the magnetic field generating portion. Further, a space is defined by forming a gap between the quartz plate 503 and the shower plate 534. A process gas to be supplied to the discharge chamber 532 is firstly supplied to this space and the process gas penetrates the shower plate 534 so as to make the space communicate with the discharge chamber 532. Accordingly, the process gas passes the above-mentioned holes which form through holes and flows into the discharge chamber 532. The above-mentioned space is formed into a buffer chamber 529 in which the process gas is dispersed from a plurality of holes and flows into the discharge chamber 532. The process gas is supplied from a controller 402 which regulates the supply of the process gas into the processing unit 103 of the fluid such as gas through a process gas line 501 and a process gas interruption valve 502.

In this manner, the process gas is introduced into the discharge chamber 532 by dispersing the process gas using the plurality of holes and, at the same time, these holes are mainly arranged at a position which faces the position where the sample is placed on the sample stand 504 and hence, these holes function as the buffer chamber 529 which can disperse the process gas such that the process gas becomes more uniform and also function to make the density of the plasma uniform. Further, a lower ring 537 is arranged below the lid member 542 and at the outer peripheral side of the quartz plate 503 and the shower plate 534. A gas passage which is communicated with the gas line 501, through which the process gas enters the buffer chamber 529, is formed in the lower ring 537.

Further, below the shower plate 534, a discharge chamber inner wall member 533 is provided, wherein the discharge chamber inner wall member 533 is brought into contact with lower surfaces of the lower ring 537 and the shower plate 534 and faces the plasma inside the vacuum container, thus defining a space of the discharge chamber 532. A discharge chamber outer wall member 536 is provided on an outer peripheral side of the inner wall member 533 such that the discharge chamber outer wall member 536 surrounds the inner wall member 533, wherein an outer wall surface of the discharge chamber inner wall member 533 and an inner wall surface of the discharge chamber outer wall member 536 are brought into contact with each other in an opposed manner. Here, in this embodiment, the inner wall member 533 and the outer wall member 536 respectively configured to have the substantially concentric cylindrical shapes. A heater is arranged to be wound around an outer peripheral surface of the outer wall member 536. By adjusting a temperature of the outer wall member 536, it is possible to regulate a temperature of the surface of the inner wall member 533 which is brought into contact with the outer wall member 536.

On the outer peripheral side of the outer wall member 536, a discharge chamber base plate 535 is arranged, wherein the discharge chamber base plate 535 is brought into contact with the lower surface of the outer wall member 536. Further, the discharge chamber base plate 535 is connected with the vacuum chamber portion which is arranged below the discharge chamber base plate 535 by way of a lower surface of the discharge chamber base plate 535. Here, the inner wall member 533 is also a member which performs a function of a ground electrode against the sample stand 504 as a role of a plasma electrode in the inside of the discharge chamber 532 and has an area necessary for making the potential of plasma stable. Since the inner wall member 533 functions as the ground electrode, it is necessary to ensure the sufficient thermal conductivity between the inner wall member 533 and the outer wall member 536 or the lid member 537 which is connected with the inner wall member 533 by contact together with the heat conduction.

All of the inner wall member 533, the outer wall member 536 and the lid member 537 are formed of conductive members and are exposed to the atmosphere side outside the processing chamber portion 500, thus facilitating the connection of lines for grounding.

In this embodiment, as described above, the vacuum chamber portion 1002 is arranged below the discharge chamber portion 1001 and the outer wall member of the vacuum chamber portion 1002 which constitutes the vacuum container is roughly divided into the upper and lower portion. The upper portion constitutes an upper outer chamber 511 which is mounted on the transport chamber 112 or a member which is mounted on the transport chamber 112 and constitutes the transport chamber 112 by bolts or the like, wherein the position of the upper outer chamber 511 is fixed in place. On the other hand, the lower portion is mounted on and fixed to the member of the above-mentioned upper outer chamber 511 from below by bolts or the like and, further, is supported on the support beams 1005 which are mounted on the bed frame 205 of the bed portion 103*b* from below. That is, the upper and lower outer chambers 511, 512 have positions thereof fixed with respect to the transport chamber 112 or the bed portion 103*b* or with respect to the floor surface on which the device 100 is installed.

Here, in the inside of the outer chambers 511, 512 which are arranged vertically and constitute an outer wall of the vacuum chamber portion 1002 of the processing chamber portion 500, at least one or more chambers are arranged, wherein one chamber is arranged inside the other chamber, thus forming a multiple chamber. In this embodiment, two chamber, that is, inner and outer chambers are provided. That is, the inner chamber 509 is provided in the inside of the upper outer chamber 511, the inner chamber 510 is provided in the inside of the lower outer chamber 512. In other word, two upper and lower inner chambers 509, 510 are provided. The sample stand 504 is arranged inside the inner chambers 509, 510, wherein a vacuum chamber 532' is formed in the inside of the innermost chamber, in which the plasma is generated. Gases and the reaction product flow in the vacuum chamber 532' and are discharged from the vacuum chamber 532'.

The vacuum chamber 532' is communicated with the discharge chamber 532 disposed above the vacuum chamber 532' and, at the same time, as will be explained later, the vacuum chamber 532' is configured to be communicable with a space defined between the inner chamber 509 and the outer chamber 511. Further, the pressure inside the vacuum chamber 532' can be reduced and, at the same time, the plasma, gas and the reaction products in the inside of the discharge chamber 532 can be moved into the vacuum chamber 532'.

Further, the inner chambers 509, 510 have the conductivity and are conductive with the outer chambers 511, 512 and assume a given potential. The inner chambers 509, 510, as described above, face the plasma generated inside the inner chambers 509, 510. To obtain the stable processing or to make the interaction with particles in the plasma, it is necessary to set the inner chambers 509, 510 to a particular potential. In this embodiment, by bringing the inner chambers 509, 510 into contact with the outer chambers 511, 512, the inner chambers 509, 510 are set to a ground potential. Accordingly, in the same manner as the discharge chamber inner wall member 533, the potential of the plasma becomes stable and the interaction becomes also stable.

To achiever grounding, the inner chamber 509 or 510 is formed of a conductive member and the inner chamber 509 or 510 is configured to be conductive with the outer chamber formed of a conductive member at an upper end portion or a lower end portion of the inner chamber 509. The inner chamber 510 has a lower surface thereof brought into contact with and also connected with an upper surface of the lower outer chamber 512 which is formed of a conductive member in the same manner, thus ensuring the conductivity. By grounding the outer chambers 511, 512 with the wiring connection, the inner chamber 509 or the inner chamber 510 is grounded.

Further, the discharge chamber portion 1001 which is mounted on the vacuum chamber portion 1002 moves a minute distance downwardly along with the reduction of pressure in the discharge chamber 532 and the vacuum chamber 532' such that the discharge chamber portion 1001 pushes the vacuum chamber portion 1002. In this manner, at a portion where the vacuum chamber portion 1002 and the discharge chamber portion 1001 are brought into contact with each other, it is possible to make a sealing which seals the inside and the outside of the discharge chamber portion 1001 and the vacuum chamber portion 1002 function effectively.

In the above-mentioned discharge chamber portion 1001, a discharge chamber base plate 535 is brought into contact with the vacuum chamber portion 1002 and pushes the vacuum chamber portion 1002. A lower surface of the discharge chamber base plate 535 is brought into contact with an upper surface of a sample (electrode) base plate 524, while a lower surface of the sample base plate 524 is brought into contact with an upper surface of the upper outer chamber 511 of the processing chamber 500 whereby these parts are connected to each other. On the other hand, the discharge chamber base plate 535 is arranged above the upper end of the upper inner chamber 509 or a flange portion formed on an upper end portion including the vicinity of the upper end of the upper inner chamber 509 and is configured to transmit a pushing force by pushing the sample base plate 524 by way of the flange portion from above. On the outer peripheral side of the flange portion of the upper inner chamber 509, the sample base plate 524 comes into pressure contact with the upper outer chamber 511 by pushing, thus applying a pushing force to the upper outer chamber 511.

In this embodiment, by regulating the temperature of the surface of the wall which constitutes the vacuum chamber, the interaction between the surface and the plasma, the particles contained in the plasma, the gas and the reaction product is regulated. In this manner, by properly regulating the interaction between the plasma and the wall surface of the vacuum chamber which faces the plasma, it is possible to bring the characteristics of the plasma such as the density and the composition of the plasma into a desired state. On the other hand, in the constitution of this embodiment, between the inner chamber 511 and the outer chamber 512 which constitute the vacuum chamber portion 1002, there exists a space whose degree of vacuum is held high due to the reduction of pressure by exhaust means. Accordingly, some ideas or consideration become necessary to regulate the temperature of the inner chamber 511 which constitutes the vacuum chamber 532'.

In this embodiment, a medium passage 541 through which a heat exchange medium passes is arranged on the inner side of the discharge chamber base plate 535, and the heat exchange medium such as water is made to circulate in the inside of the medium passage 541 so as to regulate the temperature of the discharge chamber base plate 535 and the temperature of the inner chamber 509 is regulated by way of a member which is arranged between the discharge chamber base plate 535 and the inner chamber 509 and connects these parts. That is, the discharge chamber base plate 535 and a side wall member of the inner chamber 509 are thermally connected with each other and heat is transmitted between both parts, thus performing the heat exchange. If the heat exchange is performed through the heat transfer, another member may be arranged between them. The detailed constitution of a portion where the discharge chamber portion 1001 and the vacuum chamber portion 1002 are connected with each other is explained hereinafter in conjunction with FIG. 5B.

FIG. 5B is a longitudinal cross-sectional view showing the constitution of the connection portion of the discharge chamber portion 1001 and the vacuum chamber portion 1002 shown in FIG. 5A. Below the lid member 542 as well as below the quartz plate 503 and on the side of the shower plate 534, a lid lower ring 537 is arranged such that the lid lower ring 537 surrounds the quartz plate 503 and the shower plate 534. The lid lower ring 537 has a downward surface which faces and is brought into contact with a surface of the lower discharge chamber inner wall member 533. Further, the quartz plate 503 has an upper portion thereof exposed to the atmosphere side and hence, when the pressure inside the discharge chamber 532 and the vacuum chamber 532' is reduced, an external pressure attributed to the atmosphere is applied to the quartz plate 503 and this force is transmitted as a force which pushes the lid lower ring 537 and the discharge chamber inner wall member 533 downwardly. Further, the lid lower ring 537 and the discharge chamber inner wall member 533 have portions thereof exposed to the external atmosphere side and hence, a sealing material, which seals the pressure-reduced inside and the outside, are arranged on a surface along which the quartz plate 503 and the lid lower ring 537 are brought into contact with each other, and a surface along which lid lower ring 537 and the discharge chamber inner wall member 533 are brought into contact with each other.

Further, the discharge chamber inner wall member 533 has a cylindrical shape to surround the discharge chamber 532 arranged inside the discharge chamber inner wall member 533. A flange portion which extends to the outside in the approximately horizontal direction along the cylindrical outer periphery is mounted on the outer peripheral side of the upper portion of the discharge chamber inner wall member 533. An upper surface of the flange portion is arranged to face a lower surface of the lid lower ring 537 and are connected with each other in a contact state by way of the sealing material. Below a lower surface of the flange portion of the discharge chamber inner wall member 533 and at a position along an outer peripheral surface of the cylindrical portion, the discharge chamber outer wall member 536 is arranged. The discharge chamber inner wall member 533 and the discharge chamber outer wall member 536 are connected to each other in a contact state byway of these surfaces. Along the outer periphery of the discharge chamber outer wall member 536, as described above, a heater 540 is arranged, and the heater 540 regulates the temperature of the discharge chamber outer wall member 536 and the temperature of the discharge chamber inner wall member 533 which is connected with the discharge chamber outer wall member 536.

In this manner, the discharge chamber inner wall member 533 receives the pushing force which is applied thereto by way of the lid member 537 at the flange portion and transmits the force to the members bellow the flange portion and the transmitted force is received by the upper surface of the discharge chamber outer wall member 536. In this manner, by receiving the pushing force with the surface where two members face each other in an opposed manner, the contact area of both members on the contact surface can be increased and hence, the performances such as thermal conductivity and the electric conductivity can be enhanced. Since the outer peripheral surface of the discharge chamber outer wall member 536 is exposed to the outside air, a sealing material is arranged on an upper surface of the discharge chamber outer wall member 536 which is connected with the discharge chamber inner wall member 533 in a contact manner. On the other hand, to the contact surface where the outer peripheral surface of the inner wall member 533 and the inner peripheral surface of the outer wall member 536 are connected with each other in an opposed manner, a sealing material is not arranged and the connecting portion faces the discharge chamber 532 or the vacuum chamber 532' and hence, the pressure of the contact surface is reduced along the with reduction of pressure in these chambers.

Further, the discharge chamber outer wall member 536 has a flange portion which extends to the outer peripheral side along the outer periphery thereof and a lower surface of the flange portion and an upper surface of the inner peripheral end portion of the discharge chamber base plate 535 are connected with each other in a contact state. Both members are fastened to each other by bolts which are inserted from above the discharge chamber base plate 535. Due to such a constitution, it is possible to obtain the larger contact area so that the pushing force and heat can be transmitted downwardly more efficiently whereby the electric conductivity is also enhanced. Here, in this embodiment, the discharge-chamber-portion outer wall member 536 is formed of aluminum in view of the heat transfer, the electric conductivity and the contamination or the like during the processing. However, with respect to the discharge chamber base plate 535, since the heat transfer medium passes therethrough and hence, the discharge chamber base plate 535 is formed of a member made of stainless steel in view of the heat transfer, the electric conductivity and corrosion.

Below the discharge chamber base plate 535, the upper inner chamber member 509 is arranged and an intermediate member 509', which is brought into contact with respective members, is interposed between these members. Here, the intermediate member 509' faces the discharge chamber 532 and the vacuum chamber 532' and constitutes wall surfaces which define the discharge chamber 532 and the vacuum chamber 532' and also faces the plasma or the gas, or the reaction products. The intermediate member 509' is provided to the outer peripheral side of a lower end portion of the discharge chamber inner wall member 533. That is, the intermediate member 509' has a ring-like shape and is arranged along the outer periphery of the lower end portion of the discharge chamber inner wall member 533. The intermediate member 509' includes an inner-peripheral-side flange portion and an outer-peripheral-side flange portion having a given size and also has a stepped portion which connects these flange portions. The inner-peripheral-side flange portion is arranged between an upper end portion of the upper inner chamber 509 and a lower end portion of the discharge chamber inner wall member 533 and constitutes an intermediate member which is connected with these portions. Here, the inner flange portion has an end surface of the inner peripheral end thereof brought into contact with a lower end outer peripheral surface of the discharge chamber inner wall member 533 is connected. On an outer peripheral side of the contact surface between an upper surface of the inner flange portion and the discharge chamber outer wall member 536, a sealing material is arranged and sealing material performs the sealing between the atmosphere side arranged outside the processing chamber and the inner side of the processing chamber. Due to such a constitution, The pressure in a most portion of the inner side of the contact surface is reduced along with the reduction of pressure in the inside of the discharge chamber 532 and the vacuum chamber 532' and hence, the heat transfer between members arranged at both sides of the contact surface can be impeded.

Further, an outer flange portion of the intermediate member 509' is brought into contact with and is connected with the lower surface of the discharge chamber base plate 535 and a surface of the upper end portion of the upper inner chamber 509 so as to connect the discharge chamber base plate 535 and the upper inner chamber 509. The upper inner chamber 509 has, at a portion thereof which is connected with the outer flange portion, a flange portion, which extends substantially in the horizontal direction at an upper end portion or in the vicinity of the upper end portion, and the upper end has an approximately L-shaped or a T-shaped cross section. An upper surface of the flange portion and a lower surface of the outer flange portion of the intermediate member 509' disposed above the flange portion are connected with each other in a contact state. On an inner peripheral side (center sides of the vacuum chamber and the discharge chamber) of the outer flange portion of the intermediate member 509' or on an inner peripheral side of the flange portion of the upper end of the side wall portion of the inner chamber 509, a seal which seals the inside and the outside is arranged. The outer peripheral end portion of the outer flange portion of the intermediate member 509' and the outer peripheral end of the flange portion at the upper end of the side wall of the inner chamber 509 are exposed to the atmosphere outside the processing chamber portion 500 or are communicated with the outside of atmospheric pressure and hence, the pressure on the surfaces thereof is set to approximately atmospheric pressure.

Accordingly, the atmospheric air is present between contact surfaces of the flange portions of the intermediate member 509' and the upper end of the side wall portion of the inner chamber 509 or between the contact surfaces of the outer flange portion of the intermediate member 509' and the lower surface of the discharge chamber base plate 535. Further, a pushing force attributed to the atmospheric pressure applied to the quartz plate 503, the lid lower ring 537, and the like is transmitted to the contact surfaces, thus increasing the contact area. Due to such a constitution, the performance on the heat conduction and the electric conduction through the contact portion are enhanced. Further, a seal is provided to the contact face where the lower surface of the flange portion at the upper end of the upper inner chamber 509 and the upper surface of the sample base plate 524 are brought into contact with each other.

Here, at the time of fastening the discharge chamber base plate 535 to the sample stand base plate 524 which is arranged below the discharge chamber base plate 535 using bolts or the like, to apply a pushing force which pushes the upper inner chamber 509 downwardly and, at the same time, to apply a pushing force in the direction substantially perpendicular to the sample stand base plate 524, pushed at a portion which is connected with the flange portion in a contact state, and the support base member of the sample stand 504, pushed by being brought into pressure contact with the lower portion of the upper inner chamber 509, a resilient ring 538 having resiliency is arranged between the sample stand base plate 524 and an upper portion of a suspended beam 505 such that the suspended beam 505 and the support base member 523, supported on the suspended beam 505, are brought in a slightly upwardly floated state.

In mounting the sample which constitutes the object to be processed on the sample stand 504 in the inside of the inner chamber 509, 510, a gate which can transport the wafer into the inner chamber 509 or 510 becomes necessary. Further, it is necessary to provide a valve which allows the interruption and the communication of spaces inside and outside the chamber while ensuring the hermetic sealing when the gate is opened and closed.

In this embodiment, the vacuum processing apparatus includes an atmospheric gate valve 514, which allows the communication and interruption of the processing chamber portion 500 and the transport chamber 112 by opening or hermetically closing the gate disposed between the inside of the processing chamber portion 500 and the transport chamber 112, and a process gate valve 513 which allows the communication and interruption of the inside and the outside of the inner chamber 509 by opening or hermetically closing the inner chamber 509. The atmospheric gate valve 514 is configured to be movable in the vertical direction as well as in the horizontal direction by means of drive means 522 which is arranged on an inner side wall of the transport chamber 112 and hermetically closes or opens the gate on the inner side wall. Further, the gate is provided at a position where the gate is communicated with the gate at the transport chamber 112 side when the transport chamber 112 and the processing chamber portion 500 are connected with the outer chamber 509 which constitutes the vacuum container.

As shown in FIG. 6. it is necessary to set this position to a position where there is no possibility that problems such as contacting of the sample transport device 506, which is a robot arm for transferring the wafer arranged in the inside of the transport chamber 112, arise at the time of transporting the wafer. Further, in a state that the inner chamber 509 is arranged in the inside of the outer chamber 511, the process gate is arranged at position which faces the gate of the outer chamber or the gate of the transport chamber 112 and the wafer is transported through the process gate.

Further, the process gate valve 513 which opens or hermetically closes the process gate is arranged in a space between the outer chamber 511 and the inner chamber 509. Here, the process gate valve 513 is configured to be movable in the vertical direction as well as in the horizontal direction by the drive means 521 disposed below the process gate valve 513. The process gate valve 513 is arranged on the side wall of the inner chamber at the time of closing the gate so as to hermetically close the gate on the inner side wall or open the gate. The process gate is arranged at a position and has a shape such that the process gate does not come into contact with the wafer and the robot arm which is arranged inside the transport chamber 112 for transporting the wafer in a state that the robot arm transports the wafer.

In the above-mentioned constitution, the respective gate valves are released or opened such that they do not cause troubles at the time of transporting the wafer. Further, at the time of processing the wafer, a gate valve which closes a gate arranged in the innermost chamber, that is, the inner chamber 509 in this embodiment, the process gate valve 513 and the atmospheric gate valve 514 are hermetically closed so as to interrupt the spaces inside and outside these valves. Further, at the time of removing the processing chamber or at the time of releasing the vacuum container during the maintenance operation or the like, the process gate valve 513 is released in a state that the atmospheric gate valve 514 is held in a closed state, so that the spaces inside and outside the inner chamber 509 at the inside of the outer chamber 511 are communicated with each other. Here, to prevent the process gas from flowing into the inside of the processing chamber portion 500, a process gas interruption valve 502 is driven to interrupt and close a process gas line 501.

As described above, in this embodiment, the inside and the outside of the inner chamber 509 arranged inside the outer chamber 511 are allowed to be communicated with each other to assume the substantially same pressure by releasing the process gate valve 513 or the pressures is set adjustable. Due to such a constitution, with respect to the inner chamber 509 or 510, since a load attributed to the inner and outer pressure difference which is applied the inner chamber 509 or 510 becomes small and hence, a thickness and a size of members can be reduced.

At the time of performing the inspection and the maintenance operation of the inside of the outer chamber 511 which constitutes the vacuum container of the processing chamber portion 500, the atmospheric gate valve 514 is closed so as to hermetically seal the inside of the outer chamber 511. After confirming the hermetic sealing, the process gate valve 513 is opened. In a state that the process gate is communicated and the spaces inside and outside the inner chamber 513 are communicated with each other, the atmospheric relief valve 515 is opened so as to allow the outside and the inside of the processing chamber portion 500 to be communicated with each other to elevate the pressure inside the outer chamber 511, 512 inside the processing chamber portion 500 to the approximately atmospheric pressure. That is, the release to the atmospheric pressure is performed.

After this release to the atmospheric pressure, the inside of the processing chamber portion 500 is released. First of all, the lid 503, which is arranged above the outer chamber 511 of the processing chamber portion 500 and hermetically seals the inside of the outer chamber 511, is lifted so at to release the processing chamber portion 500. Here, the lid 503 may be lifted using a crane or the like, a hinge portion may be preliminarily provided and the lid 503 may be opened more than 180 degrees by jerking the lid 503 upwardly using the hinge as a pivot axis. Next, the maintenance operation of the inner chamber 509 is performed. To facilitate this maintenance operation, for example, cleaning, exchange, repair, and the like, the inner chamber 509 is taken out from the outer chamber 511 and, thereafter, is taken out from the processing chamber portion 500.

Since the vacuum processing apparatus is provided with the constitution which can regulate or can maintain the substantially equal dynamic pressure inside and outside the inner chamber 509, it is possible to suppress the increase of the thickness of the chamber members. Accordingly, the weight of the inner chamber 509 can be reduced and the handling operation including the dismounting operation or the like can be facilitated whereby the operation time can be reduced and the operation efficiency is enhanced.

In this embodiment, the inner chamber is divided into two upper and lower chambers, that is, the upper and lower chambers 509, 510 above a sample stand block. That is, the sample stand block is arranged below the inner chamber 509. The sample stand block includes the sample stand 504, a support beam 520 and a ring-shaped support base member 523. The support beam 520 supports the sample stand 504 and is provided around a center axis of the sample stand 504, are arranged. In this embodiment, the inner chamber 509, the outer chamber 511, and the sample stand 504 have a substantially cylindrical shape and gas in a space above the sample stand 504 in the inside of the inner chamber 513 flows downwardly using a space defined between the support beams and inside the inner chamber 513 as a passage.

The support beam 520 connects the sample stand 504 and the ring-shaped support base member 523 which is arranged around the sample stand 504 and holds the sample stand 504 in the inside of the inner chamber 509. In the inside of the support base member 523, the support beam 520, and the suspending beam 505 which is connected to the support base member 523 and suspends the support base member 523, supply pipes for gases and a refrigerant which are supplied to the sample stand 504 and power supply lines for electricity are arranged. Due to such a constitution, it is possible to carry the sample stand 504, the support beam 520 and the support base 523 to the outside of the outer chamber 511 by lifting them as an integral block. The number of the maintenance and the exchange of such a sample stand 504 is smaller than the number of maintenance of the inner chamber 509 and the sample stand 504 can be moved integrally as a block and hence, the efficiency of the maintenance operation of the device can be enhanced.

Further, a sensor 539 which detects a state of the vacuum chamber 532' or the discharge chamber 532 is arranged below the vacuum chamber portion 1002. That is, a hole which accommodates the sensor therein is formed in a side wall portion of the lower outer chamber 512 and the sensor 539 which senses the pressure inside the vacuum chamber 532', the gas composition, the light emission of the plasma or the like and detects these states is arranged in the inside of the hole. A passage which is communicated with the sensor 539 or the hole in which the sensor 539 is accommodated is formed in the lower outer chamber 512 and the lower inner chamber 510. An opening of the passage is arranged on a side surface of the lower inner chamber 510 and the gas, plasma, and the like in the inside of the vacuum chamber 532' are transmitted to the sensor 539 through this passage.

The lower inner chamber 510 is arranged below the block of the sample stand 504, while an opening is arranged at a center-side portion of the inner chamber 510. The opening portion is arranged below the inner chamber 510 and is communicated with exhaust means which is arranged below the sample stand 504 and includes an exhaust valve 507 and an exhaust pump 508. The opening portion constitutes a portion where the gas inside the inner chamber 509 which flows around the sample stand 504 passes. That is, the space between the support beams 520 around the sample stand 504 and the space in the inside of the inner chamber 510 below the sample stand 504 constitute the exhaust passage in which the process gas inside the processing chamber portion 500, particles in the plasma and reactive product particles flow and are discharged.

The exhaust valve 507 which constitutes the exhaust means of the processing chamber portion 500 is a shutter type exhaust valve which includes a plurality of plate-like shutters which allow the communication and the interruption between the exhaust pump 508 disposed below the exhaust valve 507 and the space inside the inner chamber 510 and regulates an exhaust flow rate and a flow speed by variably regulating the exhaust passage area which is opened by rotating the shutter. In this manner, according to this embodiment, the exhaust means is arranged below the sample stand 504, particularly right below the sample stand 504. Then, the plasma, the processing gas, and the reaction products in the space above the sample stand 504 in the inside of the inner chamber 509 flows in the exhaust passage which reaches the exhaust valve 507 through the periphery of the sample stand 504 and the space inside the inner chamber 510 below the sample stand 504.

The plurality of support beams 520 is arranged at positions which are substantially axis-symmetrical with respect to the center axis of the sample stand 504. Here, lengths of respective exhaust passages which flow in spaces defined between the respective support beams and reach the exhaust valve 507 arranged right below the sample stand 504 become substantially equal. Accordingly, the flows of the gas, the charged particles and the reaction products in the plasma above the sample stand 504 become more uniform with respect to the circumferential direction of the sample stand 504 or the wafer, which is mounted on the sample stand 504 and constitutes a sample having an approximately disk-like shape, and hence, the distribution of the particles of the above-mentioned substances in the plasma become more uniform in the space above the wafer. Accordingly, the processing of the wafer becomes more uniform.

In this embodiment, the exhaust means includes the exhaust valve 507 which is provided with a plurality of shutters and the exhaust pump 508 disposed below the exhaust valve 5, and the exhaust valve 507 is disposed right below the sample stand 504. The plurality of shutters are, as shown in the drawing, respectively arranged substantially horizontally (in the direction of wafer surface), wherein the respective shutters are rotated about shafts which are mounted on the respective shutters whereby the area through which the opening of the inner chamber 510 and the exhaust pump 508 are communicated with each other is regulated. When these shafts are further rotated, the plates of the respective shutters are brought into contact with each other and hence, the opening is sealed and closed. Further, when the plates of the respective shutters assume the substantially horizontal posture in the direction of the sample stand 504 (the upper direction), the communicable area is maximized. Although not shown in the drawing, the exhaust valve 507 includes drive means such as a motor or the like which regulates the rotation of these shutters. The exhaust means regulates the exhaust amount and the exhaust speed by regulating the open area of these shutters and the driving of the exhaust pump 508.

Figure 9:
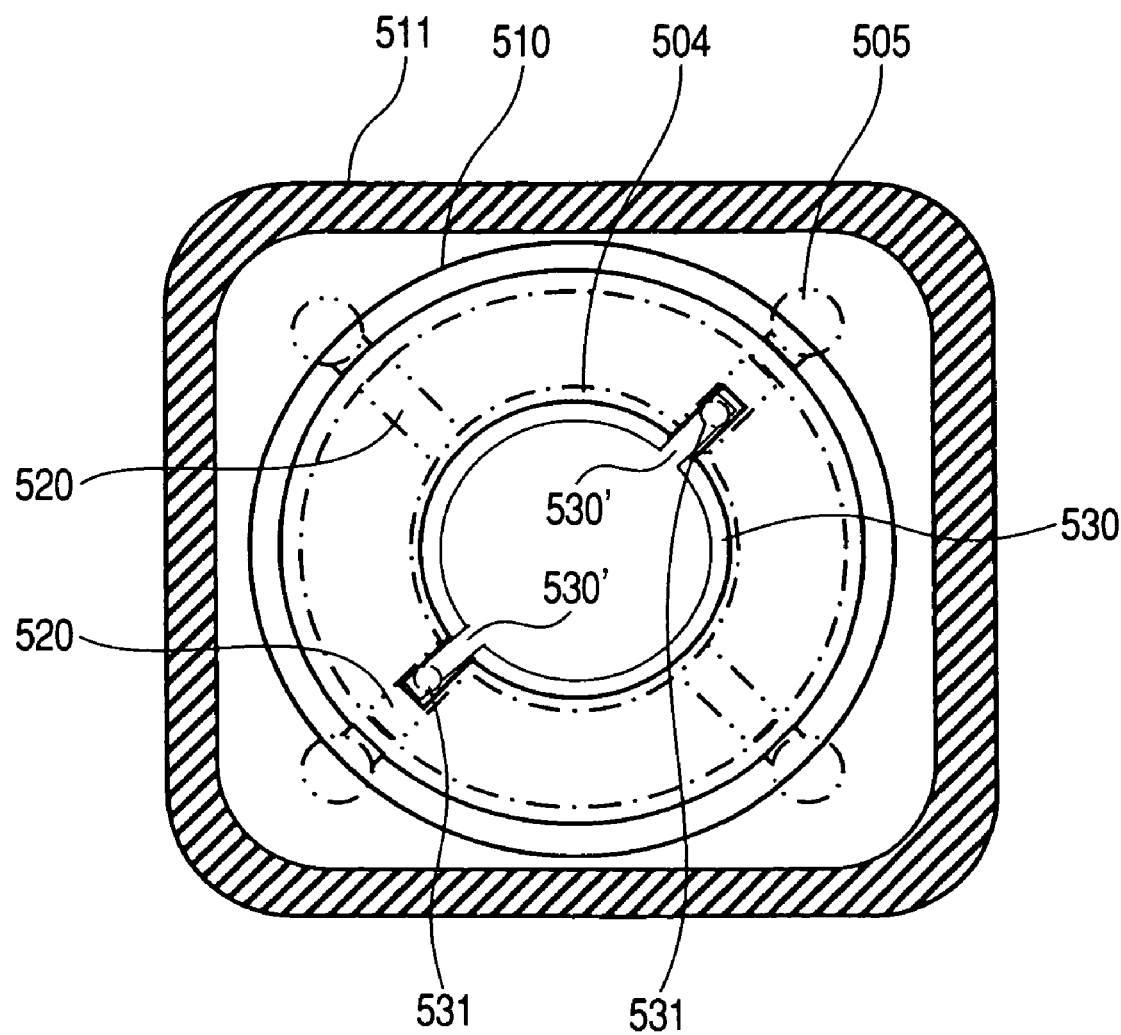
FIG. 9 is a transverse cross-sectional view showing the schematic constitution of a lower portion of the processing chamber portion shown in FIG. 6.

Further, also as shown in FIG. 9, below the sample stand 504 and above the exhaust valve 507, an exhaust gate plate 530 which covers an upper portion of an exhaust opening 531' which is formed in the outer lower chamber 512 and opens/closes (open/interrupt) the exhaust valve 507 is arranged. The exhaust gate plate 530 has an approximately disc-like shape and includes at least one of a pair of arm portions 531 which extend outwardly at a portion thereof on one outer peripheral end. By vertically operating the upper end of a pusher 531' which is arranged below the arm 531, the arm portion 531 which is connected to the upper end of the pusher 531' is lifted or pulled downwardly so as to open or close the exhaust opening 531'. The exhaust gate plate 530 is arranged such that a projection surface thereof in the downward direction is accommodated within a projection surface of the sample stand 504 arranged above the exhaust gate plate 530 and, at the same time, a projection surface of the arm portion 531' is accommodated in a projection surface of the support beam 520 arranged above the arm 531'or has at least a portion thereof overlapped to the projection surface of the support beam 520.

Further, as shown in FIG. 5A, at the time of forming the plasma and performing the processing of the sample, the exhaust gate plate 530 is lifted and moved by the pusher 531 to a position where the exhaust gate plate 530 is arranged close to the lower surfaces of the sample stand 504 and the support beam 520 or a position where the exhaust gate plate 530 is brought into contact with the lower surfaces of the sample stand 504 and the support beam 520. Due to such a constitution, it is possible to suppress a phenomenon that the flow of the remainder of the plasma, the gas, and the reaction product inside the processing chamber, which are discharged along with the processing of the sample, is interrupted by the exhaust gate plate 530 and hence, the discharge efficiency is enhanced. Further, it is possible to suppress a space necessary for stabilizing the flow of the exhaust, which is interrupted and disturbed in the inside of the vacuum chamber 532', arranged below the support beam 520 and the sample stand 504, whereby it is possible to make the processing chamber portion more miniaturized and hence, the exhaust time can be shortened whereby the efficiency of the processing is enhanced. Further, according to the above-mentioned constitution, it is possible to suppress the adhesion of the particles to the exhaust gate plate 530. Due to such a constitution, an interval between the maintenance such as the exchange of the exhaust gate plate 530 or the removal of attached substances can be prolonged.

Figure 7:
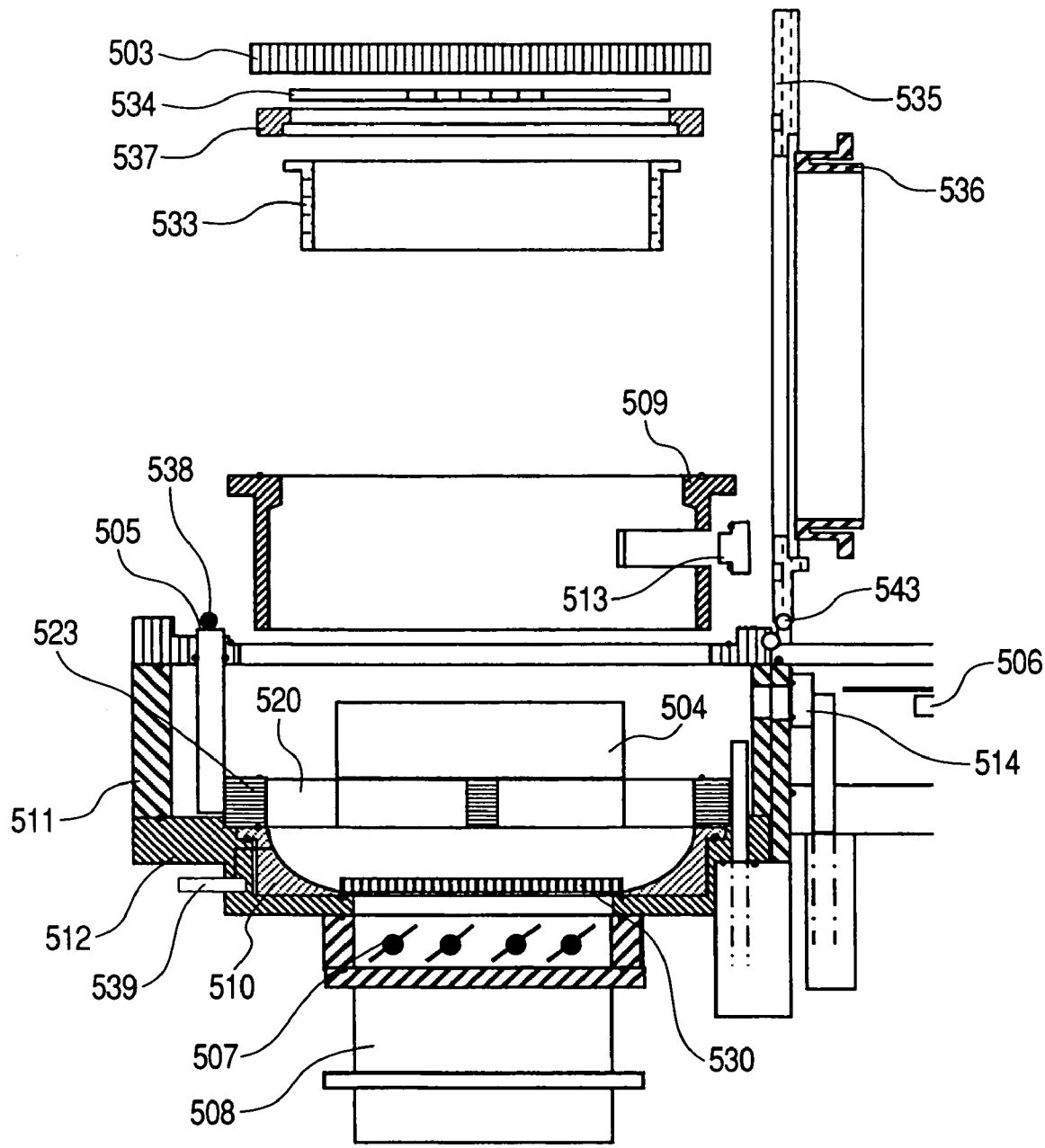
FIG. 7 is a longitudinal cross-sectional view for explaining the take-out operation of parts of the processing chamber portion shown in FIGS. 5A and 5B.

The maintenance operation of the inside of the processing chamber portion 500 is explained in conjunction with FIG. 7. FIG. 7 is a longitudinal cross-sectional view for explaining the taking out of the parts of the processing chamber portion shown in FIGS. 5A and 5B. After confirming that the pressures inside and outside the inner chamber 509 in the inside of the processing chamber portion 500 are substantially equal, the discharge chamber portion 1001 is released. First of all, after confirming that the electricity is not supplied to the processing chamber unit 103a, the magnetic field generating portion which is arranged above the discharge chamber portion 1001 and includes the electric wave source portion 525 and the coil 527, the lid member 542 which constitutes the vacuum container together with the vacuum chamber portion disposed below the lid member 542 and the antenna member which is arranged inside the lid member 542 are moved upwardly using an elevating machine such as a crane or a lifter which is arranged in the inside of the control unit 107. In this embodiment, since the lid member 542, the antenna member and the upper surface of the plate 503 disposed below them are exposed to the atmosphere, the upward movement of these parts is possible even in a state that the inside of the discharge chamber 532 and the vacuum chamber 532' is in a pressure-reduced state or in an evacuated state.

Thereafter, the plate 503, the lid lower ring 537 arranged below the plate 503 and the shower plate 534 are moved upwardly and are removed. Further, the discharge chamber inner wall member 533 is lifted upwardly and is removed. Next, the discharge chamber outer wall member 536 and the discharge chamber base plate 535 are moved upwardly. In this embodiment, these parts are connected to each other by fastening them with bolts and hence, these parts may be collectively moved at a time. Further, a hinge portion 543 is arranged at an end portion on a transport chamber 112 side of the discharge chamber base plate 535 and hence, the discharge chamber base plate 535 and, further, the discharge chamber outer wall member 536 which is in a state of being connected with the discharge chamber base plate 535 may be lifted upwardly using the hinge portion 543 as a fulcrum.

In this manner, the discharge chamber portion 1001 is moved upwardly and hence, the discharge chamber 532 and the vacuum chamber 532' are released to the atmosphere. Next, the members disposed inside the vacuum chamber portion 1002 are removed. From the inside of the outer chamber 511 which is exposed to the atmosphere by releasing, the upper inner chamber 509 is lifted upwardly and is taken out. In either a state in which the process gate valve 513 is removed from the outer chamber 511 or a state in which the process gate valve 513 is released from the inner chamber 509, the inner chamber 509 is lifted upwardly and taken out. Thereafter, the process gate valve 513 is removed and is taken out to the outside of the outer chamber 511.

The inner chambers 509, 510 are arranged in a vertically divided form such that the inner chambers 509, 510 sandwich the support beam 520 of the sample stand 504 and the support base portion 523. After collectively and upwardly lifting the sample stand 504 block and taking them to the outside of the outer chamber 511, the lower inner chamber 510 is removed upwardly and the maintenance operation such as cleaning or repairing of the inner side wall surface of the outer chamber 511 is performed. This operation is explained in conjunction with FIG. 8.

Figure 8:
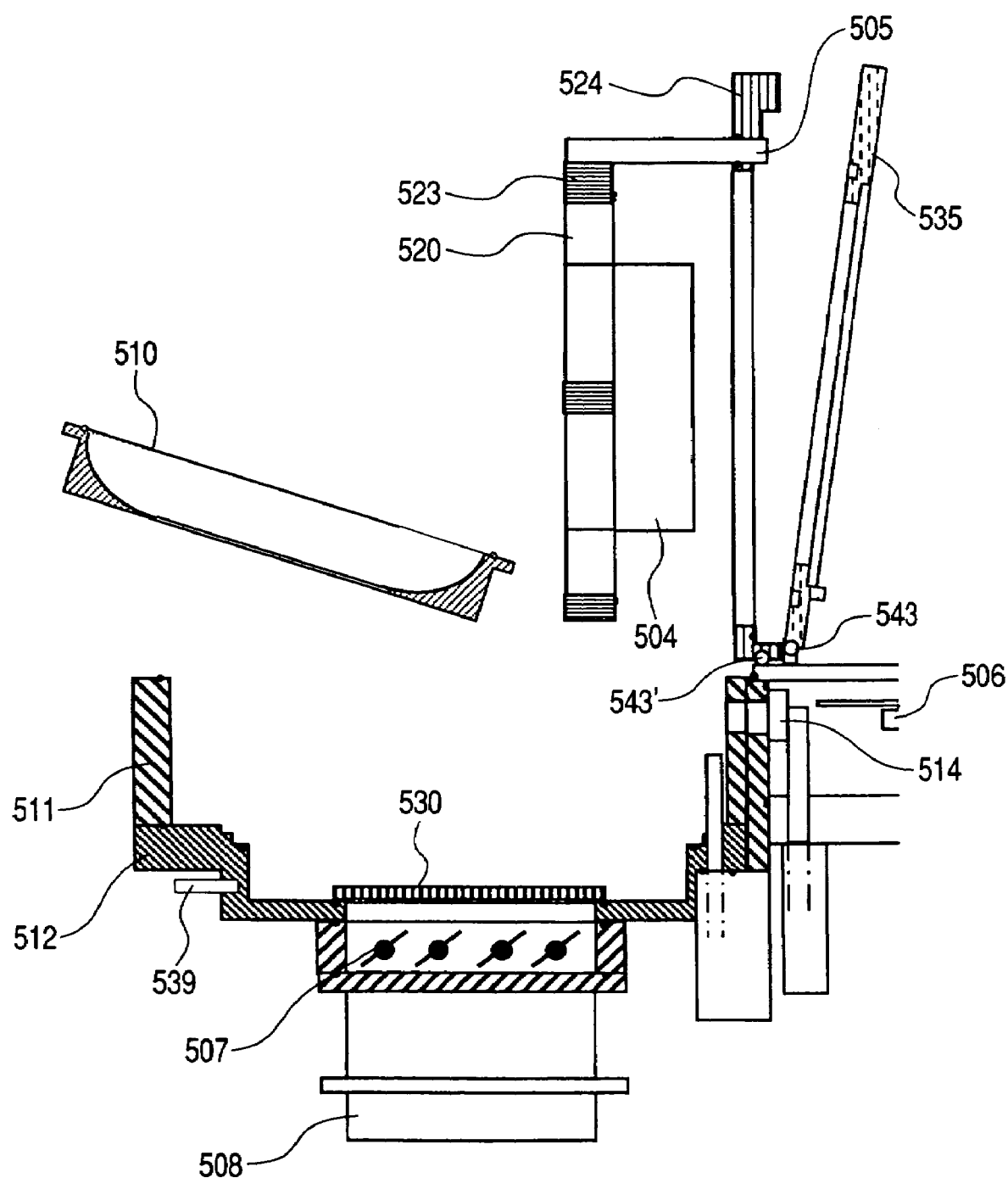
FIG. 8 is a longitudinal cross-sectional view for explaining the take-out operation of parts of the processing chamber portion shown in FIGS. 5A and 5B.

FIG. 8 is a longitudinal cross-sectional view for explaining the manner of taking out the part in the processing chamber portion shown in FIGS. 5A and 5B. As described above, after taking out the upper inner chamber 509 upwardly, the sample stand 504 block is lifted upwardly and is moved to the outside of the processing chamber portion 500. This movement may be performed such that, as shown in the drawing, the sample stand 504 which is connected to the sample stand base plate 524 by means of the suspending beam 505 may be collectively rotated upwardly as a block using the hinge portion 543', which is preliminarily mounted on the sample stand base plate 524 as a pivot axis, or the sample stand 504 may be lifted upwardly using an elevating device such as a crane. In this embodiment, although the hinge portions 543, 543' are arranged by changing respective positions, the hinge portions 543, 543' are arranged at the transport chamber 112 side of the processing chamber portion 500 and hence, when an operator performs the maintenance, the inspection, the exchange or the like by releasing the inside of the processing chamber portion 500, it is possible to ensure a space in which the operator performs the operation around the processing chamber portion 500. Further, the sample stand base plate 524 includes the sample stand 504 which is suspended by the suspending beam 505 below the sample stand base plate 524 and hence, it is necessary to ensure a space, in which the sample stand 504 and the support beam 505 pass, when the sample stand 504 is lifted by rotating the sample stand 504 using the hinge portion 543' as a fulcrum. However, by arranging the hinge portion 543' at the transport chamber 112 side, it is possible to make the vacuum chamber portion 1002 compact and, at the same time, it is possible to make the transport chamber 112 compact by reducing the size of the robot arm of a sample transport device 506 which is arranged in the inside of the transport chamber 112 for transporting the sample from the transport chamber 112. Accordingly, the installation area for the vacuum processing device can be made small. Further, it is possible to mount the members which are lifted by these hinges on an upper surface of the transport chamber 112 or it is possible to arrange the members to be supported on the upper surface of the transport chamber 112 and hence, the efficiency and the safety of the operation are enhanced.

The block of the sample stand 504 is taken out and, thereafter, the lower inner chamber 510 is taken out. The maintenance such as cleaning, repairing or the like is applied to the upper and lower inner chambers 509, 510 or these chambers are replaced with new parts. Further, after taking out these inner chambers 509, 510, the inner side walls of the outer chambers 511, 512 are cleaned and, when necessary, the maintenance such as repairing is performed. Further, the exhaust valve may be also subjected to maintenance or the replacement in the same manner, when necessary. After performing these operations, the vacuum processing apparatus is assembled in accordance with steps which are opposite to the above-mentioned steps. The lid 503 is mounted on the processing chamber portion 500 and, thereafter, lines for supplying respective gases, the refrigerant and electricity are connected to the vacuum processing apparatus.

In this manner, according to this embodiment, the vacuum processing apparatus is provided with the gate and the valve which opens and closes the valve at positions which face the outer gate of the chamber out of the multiple chambers. By releasing the inside of the processing chamber to the atmosphere when the outer gate is closed by closing the valve, it is possible to remove the processing chamber or to mount or dismount the parts. In this manner, it is possible to perform the mounting or the dismounting of the processing chamber portion of the unit while performing the processing in the processing chamber of another unit.

Further, it is possible to adjust and hold the pressures inside and outside the inner chamber at the same pressure and hence, the number of inner chamber members can be reduced and hence, the mounting and the dismounting of the members are facilitated whereby the operation efficiency is enhanced, leading to the enhancement of the operation efficiency.

Further, since the inner chamber is divided into the upper and lower chambers and hence, the handling of the inner chamber is facilitated, the operation time is shortened and the operation efficiency of the apparatus is enhanced. It is possible to handle the sample stand as the block and portions which exhibit the relatively low operation frequency are collectively moved as the block, thus enhancing the operation efficiency.

Further, by arranging the exhaust means below the sample stand, and more particularly right below the sample stand, it is possible to suppress the bending of the exhaust passage of the particles in the processing chamber such as plasma or the like. Accordingly, the exhaust speed is accelerated and hence, the operation time is shortened and the operation efficiency of the apparatus body is enhanced. Still further, by providing the exhaust valve which includes a plurality of shutters below the sample stand, the buffer space of exhaust below the sample stand can be reduced and hence, the exhaust time can be further shortened.

Still further, the support beams of the sample stand are arranged substantially in axis-symmetry with respect to the sample stand and hence, the exhaust passage can be made more straight with respect to the exhaust means below the sample stand. Further, by suppressing the lengths of the exhaust passages which pass through the periphery of the sample stand from becoming different from each other, the flow of the particles such as plasma in the inside of the processing chamber can be made uniform and hence, the density of the particles above the wafer on the sample stand can be made uniform whereby the processing of the wafer can be performed in a stable manner.

What is claimed is:

1. A vacuum processing apparatus comprising:
   a plurality of processing units, each of which has a processing chamber inside thereof, in which the pressure inside the processing chamber is reduced and plasma used for processing a sample is formed;
   a bed portion on which the plurality of processing units are arranged;
   a transport chamber which is connected with the plurality of processing units and includes a transport device for transporting the sample inside thereof; and
   a drawer portion which is mounted in the bed portion, stores a device for supplying electricity and electric signals used for processing inside the plurality of processing units, and is approximately horizontally pulled from the bed portion or stored in the bed portion,
   wherein an inside of the bed portion is covered by a plate, and an upper surface of the plate constitutes a flat surface on which an operator can ride on, and
   wherein the vacuum processing apparatus further includes a space for maintenance around the plurality of processing units on the flat surface.

2. A vacuum processing apparatus according to claim 1, wherein the drawer portion can be dismounted from and mounted in the bed portion.

3. A vacuum processing apparatus according to claim 1, wherein the device for supplying electricity and electric signals is approximately horizontally movable from the bed portion or into the bed portion.

4. A vacuum processing apparatus according to claim 1, which further includes a connector portion mounted on the bed portion, and wherein the bed portion is configured to be detachably fixed to the vacuum processing apparatus in a state that the bed portion performs the connection and the disconnection at the connector portion.

5. A vacuum processing apparatus according to claim 3, which further includes a connector portion mounted on the bed portion, and wherein the bed portion is configured to be detachably fixed to the vacuum processing apparatus in a state that the bed portion performs the connection and the disconnection at the connector portion.

* * * * *